(12) United States Patent
Kang et al.

(10) Patent No.: US 11,121,127 B2
(45) Date of Patent: Sep. 14, 2021

(54) INTEGRATED CIRCUIT CHIPS, INTEGRATED CIRCUIT PACKAGES INCLUDING THE INTEGRATED CIRCUIT CHIPS, AND DISPLAY APPARATUSES INCLUDING THE INTEGRATED CIRCUIT CHIPS

(71) Applicant: Samsung Electronics Co., Ltd., Suwon-si (KR)

(72) Inventors: Jun-gu Kang, Hwaseong-si (KR); Young-mok Kim, Yongin-si (KR); Woon-bae Kim, Seoul (KR); Dae-cheol Seong, Seoul (KR); Yune-seok Chung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/589,773

(22) Filed: Oct. 1, 2019

(65) Prior Publication Data

US 2020/0235091 A1 Jul. 23, 2020

(30) Foreign Application Priority Data

Jan. 18, 2019 (KR) .................. 10-2019-0006923

(51) Int. Cl.
*H01L 27/06* (2006.01)
*H01L 23/528* (2006.01)
*H01L 23/48* (2006.01)

(52) U.S. Cl.
CPC ........ *H01L 27/0688* (2013.01); *H01L 23/481* (2013.01); *H01L 23/5286* (2013.01); *H01L 2224/81193* (2013.01)

(58) Field of Classification Search
CPC ............. H01L 21/76898; H01L 23/481; H01L 23/5225; H01L 23/5286; H01L 27/0688
See application file for complete search history.

(56) References Cited

U.S. PATENT DOCUMENTS

| | | | |
|---|---|---|---|
| 8,421,193 B2 | 4/2013 | Huang | |
| 9,698,051 B2 | 7/2017 | Chun et al. | |
| 9,741,691 B2 | 8/2017 | Lim et al. | |
| 2002/0064906 A1* | 5/2002 | Enquist | ............... H01L 31/0465 438/109 |

(Continued)

*Primary Examiner* — Allan R Wilson
(74) *Attorney, Agent, or Firm* — Harness, Dickey & Pierce, P.L.C.

(57) ABSTRACT

An integrated circuit chip includes a circuit structure, a grounding structure, a bonding layer between the circuit structure and the grounding structure. The circuit structure includes a first substrate, an FEOL structure, and a BEOL structure. The grounding structure includes a second substrate and a grounding conductive layer. The integrated circuit chip includes a first penetrating electrode portion connected to the grounding conductive layer based on extending through the first substrate, the FEOL structure, the BEOL structure, and the bonding layer such that the first penetrating electrode portion is isolated from direct contact with the integrated circuit portion in a horizontal direction extending parallel to an active surface of the first substrate. An integrated circuit package and a display device each include the integrated circuit chip.

19 Claims, 28 Drawing Sheets

(56) References Cited

U.S. PATENT DOCUMENTS

| | | | |
|---|---|---|---|
| 2011/0042820 A1* | 2/2011 | Knickerbocker | ............................ H01L 21/76898 257/774 |
| 2013/0277821 A1* | 10/2013 | Lundberg | ............ H01L 25/0657 257/713 |
| 2015/0076611 A1* | 3/2015 | Maki | ................... H01L 27/1112 257/368 |
| 2015/0294963 A1 | 10/2015 | Lin | |
| 2016/0204073 A1 | 7/2016 | Beak et al. | |
| 2017/0154875 A1 | 6/2017 | Uzoh et al. | |

* cited by examiner

XIB - XIB'

INTEGRATED CIRCUIT CHIPS, INTEGRATED CIRCUIT PACKAGES INCLUDING THE INTEGRATED CIRCUIT CHIPS, AND DISPLAY APPARATUSES INCLUDING THE INTEGRATED CIRCUIT CHIPS

CROSS-REFERENCE TO RELATED APPLICATION

This application claims the benefit of Korean Patent Application No. 10-2019-0006923, filed on Jan. 18, 2019, in the Korean Intellectual Property Office, the disclosure of which is incorporated herein in its entirety by reference.

BACKGROUND

The inventive concepts relate to integrated circuit chips, integrated circuit packages including the integrated circuit chips, and display apparatuses including the same, and more particularly, to integrated circuit chips having an electromagnetic shielding structure, integrated circuit packages including the integrated circuit chips, and display apparatuses including the same.

In accordance with the increase in a frame rate of a frame to be displayed on an display apparatus, the increase in resolution of the display apparatus, the increase in a three-dimensional image displayed on the display apparatus, and the like, the power consumption of one or more drivers in one or more integrated circuit chips that drive a data line of the display apparatus is increased and the peak of current applied thereto is increased. As a result of such increased power consumption, electromagnetic interference (EMI) generated in the integrated circuit chips may be increased.

SUMMARY

The inventive concepts provide one or more integrated circuit chips each having a structure configured to ensure a tolerance against EMI while reducing the increase of an area of said integrated chip due to a structure for shielding EMI.

The inventive concepts further provide one or more integrated circuit packages and one or more display apparatuses including one or more integrated circuit chips configured to ensure the tolerance against EMI while reducing the increase of an area due to a structure for shielding EMI.

According to some example embodiments of the inventive concepts, an integrated circuit chip may include a circuit structure including a first substrate having an active surface and a back surface opposite to the active surface, a front-end-of-line (FEOL) structure on the active surface of the first substrate, the FEOL structure including an integrated circuit portion, and a back-end-of-line (BEOL) structure on the FEOL structure, the BEOL structure including a plurality of multilayer interconnection structures that are connected to the integrated circuit portion. The integrated circuit chip may include a grounding structure including a second substrate isolated from direct contact with the first substrate with the FEOL structure and the BEOL structure therebetween, and a grounding conductive layer between the second substrate and the BEOL structure. The integrated circuit chip may include a bonding layer between the circuit structure and the grounding structure, and a first penetrating electrode portion connected to the grounding conductive layer based on extending through the first substrate, the FEOL structure, the BEOL structure, and the bonding layer such that the first penetrating electrode portion is isolated from direct contact with the integrated circuit portion in a horizontal direction extending parallel to an active surface of the first substrate.

According to some example embodiments of the inventive concepts, an integrated circuit chip may include a circuit structure including a first substrate including an integrated circuit device region and an edge region surrounding the integrated circuit device region in a plane extending parallel to an active surface of the first substrate, a front-end-of-line (FEOL) structure on an active surface of the first substrate in the integrated circuit device region, the FEOL structure including an integrated circuit portion, and a back-end-of-line (BEOL) structure connected to the integrated circuit portion, the BEOL structure including a plurality of multilayer interconnection structures. The integrated circuit chip may include a grounding structure including a second substrate isolated from direct contact with the first substrate in the integrated circuit device region and the edge region with the FEOL structure and the BEOL structure therebetween, and a grounding conductive layer between the second substrate and the BEOL structure. The integrated circuit chip may include a bonding layer between the circuit structure and the grounding structure in the integrated circuit device region and the edge region, a first penetrating electrode portion connected to the grounding conductive layer based on extending through the first substrate, the FEOL structure, the BEOL structure, and the bonding layer in the edge region and extending in a vertical direction extending perpendicular to an active surface of the first substrate, and a second penetrating electrode portion connected to one multilayer interconnection structure of the plurality of multilayer interconnection structures based on extending through the first substrate and the FEOL structure in the integrated circuit device region.

According to some example embodiments of the inventive concepts, an integrated circuit chip may include a circuit structure including a first substrate having an active surface and a back surface opposite to each other, a front-end-of-line (FEOL) structure on the active surface of the first substrate, the FEOL structure including an integrated circuit portion, and a back-end-of-line (BEOL) structure on the FEOL structure, the BEOL structure including a plurality of multilayer interconnection structures that are connected to the integrated circuit portion. The integrated circuit chip may include a grounding structure including a second substrate facing the active surface, and a grounding conductive layer between the second substrate and the BEOL structure. The integrated circuit chip may include a first penetrating electrode portion connected to the grounding conductive layer base on extending through the first substrate, the FEOL structure, and the BEOL structure such that the first penetrating electrode portion is isolated from direct contact with the integrated circuit portion in a horizontal direction extending parallel to an active surface of the first substrate, a second penetrating electrode portion connected to one multilayer interconnection structure of the plurality of multilayer interconnection structures based on extending through the first substrate and the FEOL structure, a first connection terminal on the back surface of the first substrate and configured to be electrically connected to the first penetrating electrode portion, and a second connection terminal on the back surface of the first substrate and configured to be electrically connected to the second penetrating electrode portion.

According to some example embodiments of the inventive concepts, there is provided an integrated circuit package including any one of the integrated circuit chips according to some example embodiments of the inventive concepts; a supporting substrate having a mounting surface on which the integrated circuit chip is mounted; and a plurality of interconnections formed on the supporting substrate, wherein the first connection terminal and the second connection terminal of the integrated circuit chip are each electrically connected to one interconnection from among the plurality of interconnections.

According to some example embodiments of the inventive concepts, there is provided a display apparatus including a display driver IC (DDI) chip including any one of the integrated circuit chips according to some example embodiments of the inventive concepts; and a display panel configured to display one or more instances of display data under control of the DDI chip.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF SOME EXAMPLE EMBODIMENTS

Figure 1:
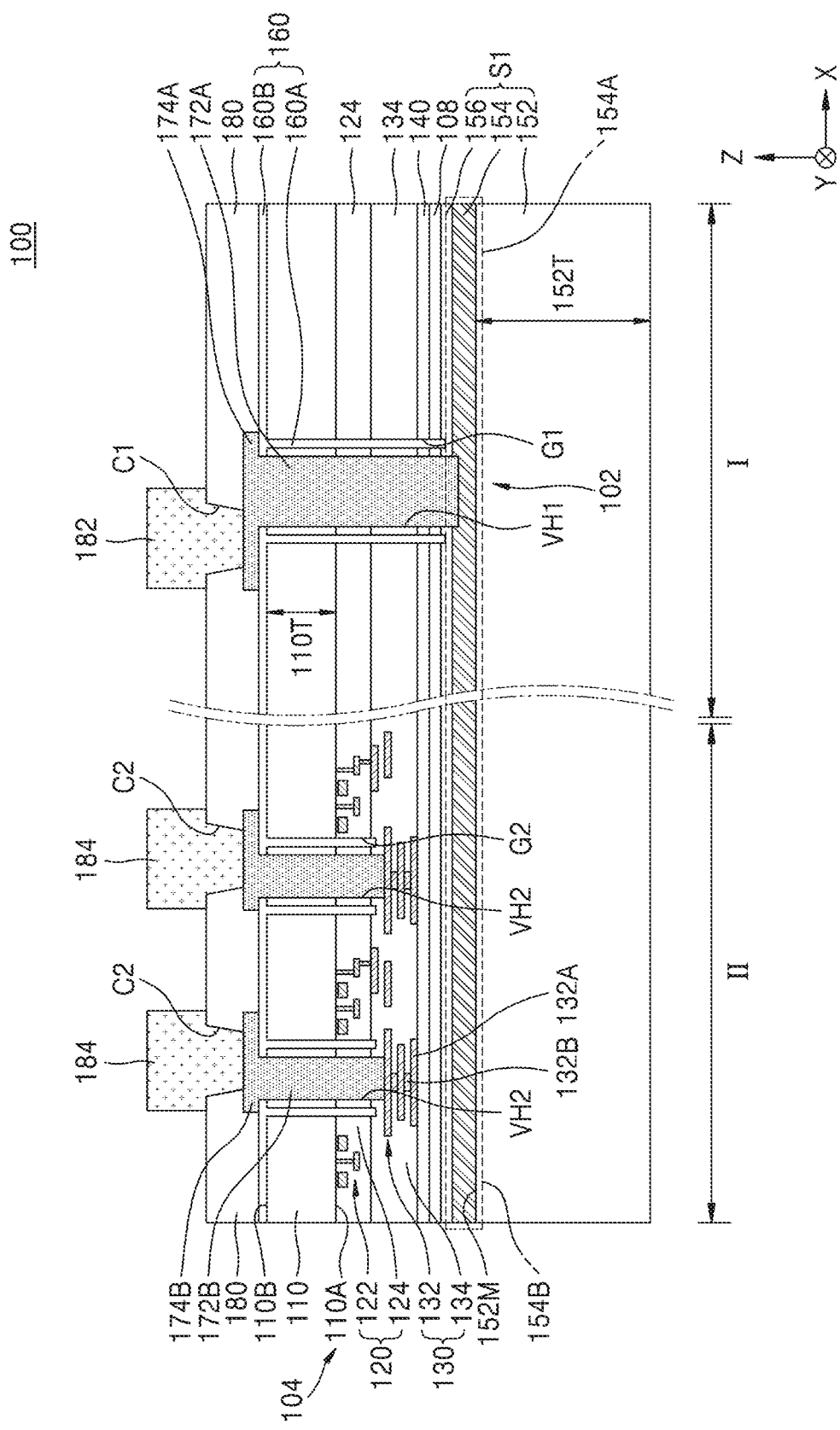
FIGS. 1, 2, 3, 4, 5, 6, 7, and 8 are cross-sectional views showing a portion of an integrated circuit chip according to some example embodiments of the inventive concepts.

Hereinafter, some example embodiments of the inventive concepts will be described in detail with reference to the accompanying drawings. The same reference numerals are used for the same elements in the drawings, and a duplicate description thereof will be omitted.

FIG. 1 is a cross-sectional view of a portion of an integrated circuit chip 100 according to some example embodiments of the inventive concepts.

Referring to FIG. 1, the integrated circuit chip 100 may include a circuit structure 104 and a grounding structure 51. The circuit structure 104 and the grounding structure S1 are coupled by a bonding layer 108 sandwiched between the circuit structure 104 and the grounding structure S1.

The integrated circuit chip 100 may include an edge region I and an integrated circuit device region II. The edge region I may be a region surrounding at least a part or an entirety of the integrated circuit device region II in an X-Y plane (e.g., a horizontal plane extending parallel to an active surface 110A of the first substrate 110). The circuit structure 104, the grounding structure S1, and the bonding layer 108 may each extend over the edge region I and the integrated circuit device region II. As shown in FIG. 1, the bonding layer 108 may be between the circuit structure 104 and the grounding structure S1 in the integrated circuit device region II and the edge region I.

The circuit structure 104 may include a first substrate 110 having an active surface 110A and a back surface 110B opposite to each other (e.g., the back surface 110B is opposite to the active surface 110A as shown in at least FIG. 1), a front-end-of-line (FEOL) structure 120 on the active surface 110A of the first substrate 110, and a back-end-of-line (BEOL) structure 130 on the FEOL structure 120.

It will be understood that an element "on" another element may be "above" or "below" the other element. Additionally, an element "on" another element may be directly on the other element, such that the elements are in direct contact with each other, or indirectly on the other element, such that the elements are isolated from direct contact with each other by one or more interposing structures and/or spaces.

The first substrate 110 may include a semiconductor material, for example, silicon (Si). A thickness 110T of the first substrate 110 may be about 5 μm to about 10 μm, but is not limited thereto.

The FEOL structure 120 may include an integrated circuit portion 122 and an interlayer insulating film 124 for mutually insulating individual devices comprising the integrated circuit portion 122 from each other. The integrated circuit portion 122 may include various circuits and various interconnection structures formed on the active surface 110A in the integrated circuit device region II. As shown in at least FIG. 1, the FEOL structure may be on an active surface 110A of the first substrate 110 in the integrated circuit device region II. The integrated circuit portion 122 (also referred to as an integrated circuitry structure) may include a plurality of individual devices of various kinds. The integrated circuit portion 122 may include a variety of microelectronic devices, such as a metal-oxide-semiconductor field effect transistor (MOSFET), a system large scale integration (LSI), a micro-electro-mechanical system (MEMS), an active device, or a passive device. Some of the plurality of individual devices comprising the integrated circuit portion 122 may be configured to be electrically connected to a conductive region of the first substrate 110, for example to a well made of ("at least partially comprising") an ion implantation region. Each individual device of the plurality of individual devices may be electrically separated from other individual devices adjacent thereto by the interlayer insulating film 124.

The integrated circuit portion 122 may be formed (e.g., may be located) only in the integrated circuit device region II from among the edge region I and the integrated circuit device region II. The interlayer insulating film 124 may be formed to cover the active surface 110A of the first substrate 110 in the edge region I and the integrated circuit device region II.

The BEOL structure 130 may include a plurality of multilayer interconnection structures 132 connected to the integrated circuit portion 122 of the FEOL structure 120 and an intermetal insulating film 134 for mutually insulating portions of the plurality of multilayer interconnection structures 132 from each other. It will be understood that the BEOL structure 130 may be connected to the integrated circuit portion 122. The plurality of multilayer interconnection structures 132 may be formed only in the integrated circuit device region II from among the edge region I and the integrated circuit device region II. The intermetal insulating film 134 may be formed to cover the FEOL structure 120 in the edge region I and the integrated circuit device region II.

The plurality of multilayer interconnection structures 132 may each include a plurality of interconnection layers 132A and a plurality of contact plugs 132B interconnecting the plurality of interconnection layers 132A therebetween. The plurality of interconnection layers 132A and the plurality of contact plugs 132B may each include a metal layer and a conductive barrier film surrounding the surface of the metal layer. The metal layer may include Cu, W, Ta, Ti, Co, Mn, Al, or a combination thereof, and the conductive barrier film may include Ta, Ti, TaN, TiN, AlN, WN, or a combination thereof. The number of stacked layers of the plurality of interconnection layers 132A stacked in a vertical direction extending perpendicular to the active surface 110A (a Z direction) in each of the plurality of multilayer interconnection structures 132 is not particularly limited and may be variously selected. The intermetal insulating film 134 may include a silicon oxide film, a silicon nitride film, a silicon oxynitride film, or a combination thereof.

The circuit structure 104 may further include a first passivation film 140 covering the BEOL structure 130 in the edge region I and the integrated circuit device region II. The first passivation film 140 may be in contact with the bonding layer 108. The first passivation film 140 and the bonding layer 108 may include different materials. For example, the first passivation film 140 may include an oxide film, a nitride film, or a combination thereof, and the bonding layer 108 may be a SiCN film.

The grounding structure S1 may include a second substrate 152, a grounding conductive layer 154 formed on the main surface 152M of the second substrate 152, and an insulating film 156 covering the grounding conductive layer 154. As shown in at least FIG. 1, the second substrate 152 may face the active surface 110A. As shown in at least FIG. 1, the insulating film 156 may be between the grounding conductive layer 154 and the bonding layer 108. The insulating film 156 may be spaced apart from the second substrate 152 with the grounding conductive layer 154 therebetween. The insulating film 156 and the bonding layer 108 may include different materials, such that the bonding layer 108 and the insulating film 156 include different total material compositions. The second substrate 152 may be isolated from direct contact with the first substrate 110 with the FEOL structure 120 and the BEOL structure 130 between the first substrate 110 and the second substrate 152. The second substrate 152 may be isolated from direct contact with the first substrate 110 in the integrated circuit device region II and the edge region I with the FEOL structure 120 and the BEOL structure 130 therebetween. The grounding conductive layer 154 may be between the second substrate 152 and the BEOL structure 130. In some example embodiments, the grounding conductive layer 154 is entirely on the second substrate 152 along a main surface 152M of the second substrate 152, where the main surface 152M of the second substrate 152 faces the active surface 110A. Restated, the grounding conductive layer 154 may extend entirely on the second substrate 152. In some example embodiments, the grounding conductive layer 154 may extend entirely on the second substrate 152 so as to overlap with the first penetrating electrode portion 172A and one or more second penetrating electrode portions in a vertical direction extending perpendicular to the active surface 110A, (e.g., Z-direction). As shown in at least FIG. 1, the grounding conductive layer 154 may face the active surface 110A of the first substrate 110 in the integrated circuit device region II and the edge region I. The second substrate 152, the grounding conductive layer 154, and the insulating film 156 may each extend over the edge region I and the integrated circuit device region II. The insulating film 156 may be in contact with the bonding layer 108. The insulating film 156 and the bonding layer 108 may include different materials. For example, the insulating film 156 may include a silicon oxide film, and the bonding layer 108 may be a SiCN film.

In some example embodiments, the second substrate 152 may be made of ("may at least partially comprise") a semiconductor material, silicon (Si). The second substrate 152 may have a thickness 152T of about 300 μm to about 400 μm, but is not limited thereto.

In some example embodiments, the grounding conductive layer 154 may be made of ("may at least partially comprise") an ion implanted semiconductor layer. For example, the grounding conductive layer 154 may include a P++ type Si layer or an N++ type Si layer. In some example embodiments, the grounding conductive layer 154 may be made of ("may at least partially comprise") a Si layer doped with boron (B). In some example embodiments, the grounding conductive layer 154 may be made of ("may at least partially comprise") a metal containing conductive layer. For example, the grounding conductive layer 154 may include Ti, TiN, W, TiW, or a combination thereof. Accordingly, it will be understood that the grounding conductive layer 154 may include a semiconductor layer including impurity ions or a metal-containing conductive layer.

The integrated circuit chip 100 may include a first penetrating electrode portion 172A passing ("extending") through the first substrate 110, the interlayer insulating film 124 of the FEOL structure 120, the intermetal insulating film 134 of the BEOL structure 130, the first passivation film 140, the bonding layer 108 and the insulating film 156 and connected to the grounding conductive layer 154. Accordingly, it will be understood that the first penetrating electrode portion 172A may be connected to the grounding conductive layer 154 based on extending through the first substrate 110, the FEOL structure 120, the BEOL structure 130, and the bonding layer 108. The first penetrating electrode portion 172A may be connected to the grounding conductive layer 154 based on extending through the first substrate 110, the FEOL structure 120, the BEOL structure 130, and the bonding layer 108 in the edge region I and extending in a vertical direction extending perpendicular to the active surface 110A of the first substrate 110. The first penetrating electrode portion 172A may be arranged ("may be located") at a position spaced apart from ("isolated from direct contact with") the integrated circuit portion 122 in the horizontal direction extending parallel to an active surface 110A of the first substrate 110 (e.g., an X-direction and/or a Y-direction), such that the first penetrating electrode portion 172A is isolated from direct contact with the integrated circuit portion 122 in the horizontal direction. One end of the first penetrating electrode portion 172A may be in contact with the grounding conductive layer 154. The other end of the first penetrating electrode portion 172A may be in contact with a first pad portion 174A. The first pad portion 174A may extend in a horizontal direction while facing the back surface 110B of the first substrate 110. The first penetrating electrode portion 172A and the first pad portion 174A may be integrally connected.

The integrated circuit chip 100 may further include a plurality of second penetrating electrode portions 172B formed in the integrated circuit device region II. Each of the plurality of second penetrating electrode portions 172B may extend in the vertical direction (the Z direction) through the first substrate 110, the interlayer insulating film 124 of the FEOL structure 120 and a part of the intermetal insulating film 134 of the BEOL structure 130 and may be connected to one interconnection layer 132A selected from the plurality of interconnection layers 132A of the multilayer interconnection structures 132. One end of each of the plurality of second penetrating electrode portions 172B may be in contact with the interconnection layer 132A adjacent to the FEOL structure 120 among the plurality of interconnection layers 132A comprising the multilayer interconnection structure 132. Restated, each second penetrating electrode portion 172B may be connected to a separate, respective multilayer interconnection structure 132 (e.g., one multilayer interconnection structure 132) of the plurality of multilayer interconnection structures 132 based on extending through the first substrate 110 and the FEOL structure 120 (e.g., extending through the first substrate 110 and the FEOL structure 120 in the integrated circuit device region II). The other end of each of the plurality of second penetrating electrode portions 172B may be in contact with any one of a plurality of second pad portions 174B. The plurality of second penetrating electrode portions 172B may extend in the horizontal direction while facing the back surface 110B of the first substrate 110. The plurality of second penetrating electrode portions 172B and the plurality of second pad portions 174B may be integrally connected one by one.

A vertical length (a Z direction length, a length in the vertical direction extending perpendicular to the active surface 110A of the first substrate 110, or the like) of the first penetrating electrode portion 172A and a vertical length (the Z direction length) of each of the plurality of second penetrating electrode portions 172B may be different from each other. As illustrated in FIG. 1, the vertical length of the first penetrating electrode portion 172A may be greater than the vertical length of each of the plurality of second penetrating electrode portions 172B, but is not limited thereto.

In some example embodiments, each of the first penetrating electrode portion 172A, the first pad portion 174A, the plurality of second penetrating electrode portions 172B, and the plurality of second pad portions 174B may be made of ("may at least partially comprise") a metal-containing conductive layer including metal, conductive metal nitride, or a combination of thereof. For example, each of the first penetrating electrode portion 172A, the first pad portion 174A, the plurality of second penetrating electrode portions 172B, and the plurality of second pad portions 174B may include W, Al, Ti, TiN, or a combination thereof.

The grounding conductive layer 154 may extend along a main surface 152M of the second substrate 152 to face the active surface 110A of the first substrate 110 in the edge region I and the integrated circuit device region II. As shown in FIG. 1, the grounding conductive layer 154 may include a portion 154A in direct contact with the first penetrating electrode portion 172A in the edge region I and a portion 154B vertically overlapping with the integrated circuit portion 122 in the integrated circuit device region II (e.g., overlapping with the integrated circuit portion 122 in a vertical direction that extends perpendicular to an active surface 110A of the first substrate 110.

In the edge region I, the grounding conductive layer 154 and the first penetrating electrode portion 172A may constitute an electromagnetic shielding structure 102. The grounding conductive layer 154, the first penetrating electrode portion 172A, and the first pad portion 174A may provide a conductive path for electromagnetic shielding of the integrated circuit chip 100.

In some example embodiments, the first penetrating electrode portion 172A may have an island-shaped planar structure. In some example embodiments, the first penetrating electrode portion 172A may have a ring-shaped planar structure extending along an edge of the integrated circuit chip 100 in the edge region I so as to surround the integrated circuit device region II of the integrated circuit chip 100. The plurality of second penetrating electrode portions 172B may each have an island-shaped planar structure.

Grooves G1 and G2 may be formed around each of the first penetrating electrode portion 172A and the plurality of second penetrating electrode portions 172B in the edge region I and the integrated circuit device region II. The groove G1 in the edge region I may include a ring-shaped space extending in the vertical direction passing through the first substrate 110, the interlayer insulating film 124 of the FEOL structure 120, the intermetal insulating film 134 of the BEOL structure 130, the first passivation film 140, and the bonding layer 108. The groove G2 in the integrated circuit device region II may include a ring-shaped space extending in the vertical direction passing through the first substrate 110 and the interlayer insulating film 124 of the FEOL structure 120.

An insulating film 160 may be formed in the edge region I and the integrated circuit device region II. The insulating film 160 may include a plurality of penetrating insulating portions 160A filling the grooves G1 and G2 and an insulating liner portion 160B integrally connected to the plurality of penetrating insulating portions 160A and covering the back surface 110B of the first substrate 110. The plurality of penetrating insulating portions 160A may each surround at least a part of a separate, respective electrode portion of the first penetrating electrode portion 172A and the second penetrating electrode portion 172B at the positions spaced apart from ("isolated from direct contact with") each electrode portion of the first penetrating electrode portion 172A and the second penetrating electrode portion 172B in the horizontal direction extending parallel to the active surface 110A of the first substrate 110. The first pad portion 174A in the edge region I and the plurality of second pad portions 174B in the integrated circuit device region II may be spaced apart from the first substrate 110 with the insulating liner portion 160B therebetween. Accordingly, a penetrating insulating portion 160A may surround at least a portion of the first penetrating electrode portion 172A at a position isolated from direct contact with the first penetrating electrode portion 172A in the horizontal direction in the edge region I and extending in the vertical direction based on extending through the first substrate 110, the FEOL structure 120, the BEOL structure 130, and the bonding layer 108. The insulating film 160 may include an aluminum oxide film or a hafnium oxide film. In some example embodiments, at least a portion of the plurality of penetrating insulating portions 160A may include an air gap. As used herein, the term "air" may refer to the atmosphere or other gases that may be present in the manufacturing process. The plurality of the penetrating insulating portions 160A may have a ring-shaped planar structure. In some example embodiments, the insulating protective film 760 and a penetrating insulating portion 160A (e.g., a penetrating insulating portion 160A surrounding at least a portion of the first penetrating electrode portion 172A) may include a same total material composition as the penetrating insulating portion 160A.

The insulating film 160, the first pad portion 174A and the plurality of second pad portions 174B in the edge region I and the integrated circuit device region II may be covered with a second passivation film 180. The second passivation film 180 may include an oxide film, a nitride film, or a combination thereof.

The integrated circuit chip 100 may include a first connection terminal 182 and a plurality of second connection terminals 184 formed on the second passivation film 180. As shown in at least FIG. 1, the first connection terminal 182 may be on the back surface 110B of the first substrate 110 and each second connection terminal 184 may be on the back surface 110B of the first substrate 110. The first connection terminal 182 may be connected to the first pad portion 174A through a first contact hole C1 formed in the second passivation film 180 in the edge region I. Accordingly, the first connection terminal 182 may be configured to be electrically connected to the first penetrating electrode portion 172A. The plurality of second connection terminals 184 may be each connected to the second pad portion 174B through a second contact hole C2 formed in the second passivation film 180 in the integrated circuit device region II. Accordingly, each second connection terminal 184 may be configured to be electrically connected to a separate one second penetrating electrode portion 172B. In some example embodiments, the first connection terminal 182 and the plurality of second connection terminals 184 may be made of ("may at least partially comprise") gold (Au) bump.

Figure 2:
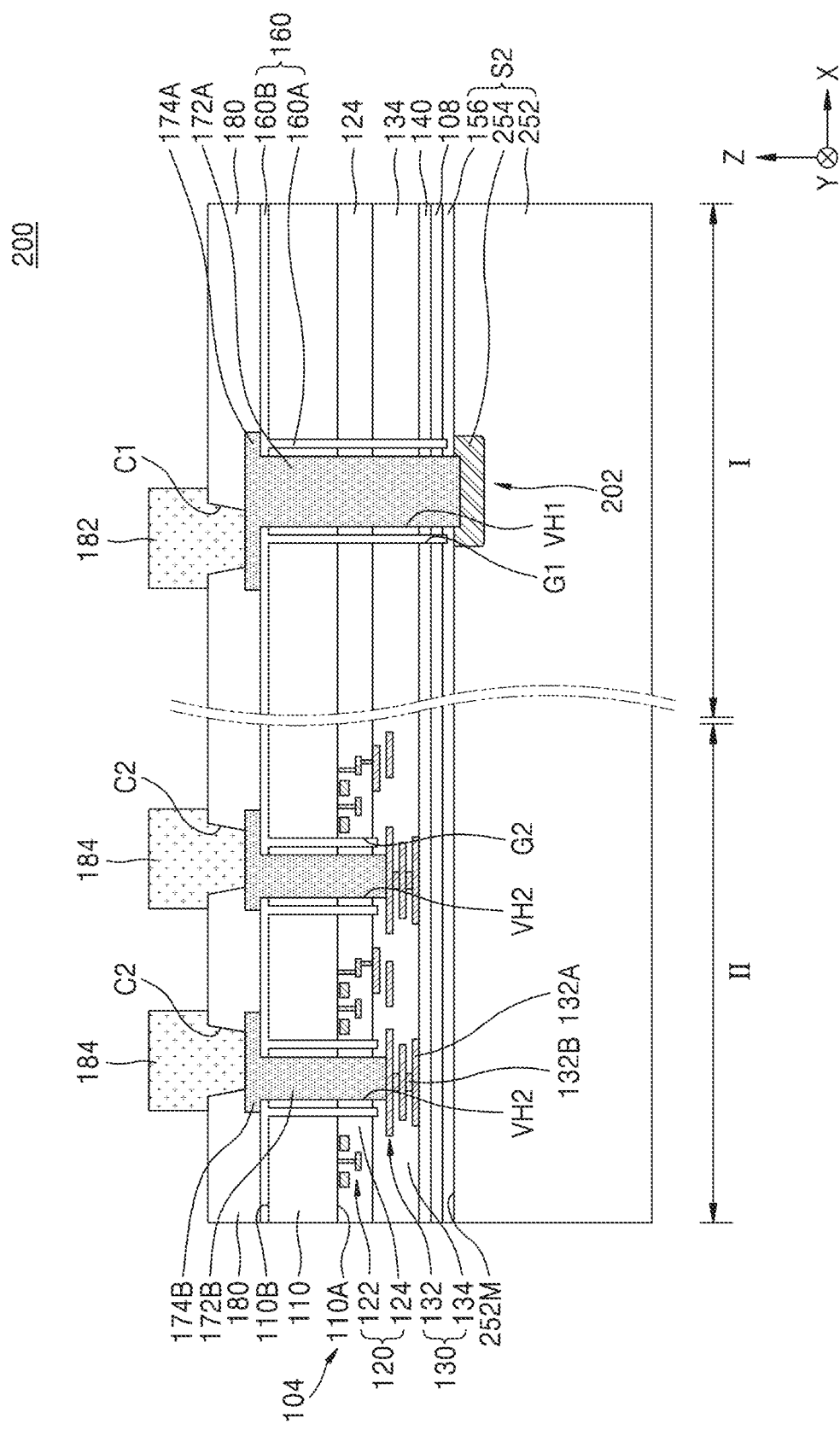

FIG. 2 is a cross-sectional view of a portion of an integrated circuit chip 200 according to some example embodiments of the inventive concepts.

Referring to FIG. 2, the integrated circuit chip 200 may have generally the same configuration as the integrated circuit chip 100 illustrated in FIG. 1. However, the integrated circuit chip 200 may include a grounding structure S2 instead of the grounding structure S1 illustrated in FIG. 1. The grounding structure S2 may include a second substrate 252, a grounding conductive layer 254 formed in a local region of the second substrate 252 in the edge region I and the insulating film 156 covering a main surface 252M of the second substrate 252 and the grounding conductive layer 254. Restated, and as shown in FIG. 2, the grounding conductive layer 254 may be limited to extending locally (e.g., in the edge region I out of the integrated circuit device region II and the edge region I). The grounding conductive layer 254 may be limited to extending locally around one end of the first penetrating electrode portion 172A, and thus may extend on a limited portion of the second substrate 152, such that the grounding conductive layer 254 overlaps with the first penetrating electrode portion 172A in a vertical direction extending perpendicular to the active surface 110A of the first substrate 110 and does not overlap with the integrated circuit portion 122 in the vertical direction. The grounding conductive layer 154 may include a semiconductor layer containing impurity ions.

The detailed configuration of the second substrate 252 is generally similar to that described for the second substrate 152 with reference to FIG. 1. However, the main surface 252M of the second substrate 252 may be in contact with the insulating film 156. The grounding conductive layer 254 may be made of ("may at least partially comprise") a semiconductor layer obtained by implanting impurity ions into a part of the second substrate 252 and having a higher impurity ion concentration than other parts of the second substrate 252. In some example embodiments, the grounding conductive layer 254 may include a P++ type ion implanted region or an N++ type ion implanted region. For example, the grounding conductive layer 254 may be made of ("may at least partially comprise") an ion implanted region doped with boron (B).

One end of the first penetrating electrode portion 172A in the edge region I may be in contact with the grounding conductive layer 254. The grounding conductive layer 254 may not be formed in the integrated circuit device region II so as not to overlap vertically with the integrated circuit portion 122, but may be formed only in the vicinity of one end of the first penetrating electrode portion 172A in the edge region I.

In the edge region I, the grounding conductive layer 254 and the first penetrating electrode portion 172A may constitute an electromagnetic shielding structure 202. The grounding conductive layer 254, the first penetrating electrode portion 172A, and the first pad portion 174A may provide a conductive path for electromagnetic shielding of the integrated circuit chip 200.

Figure 3:
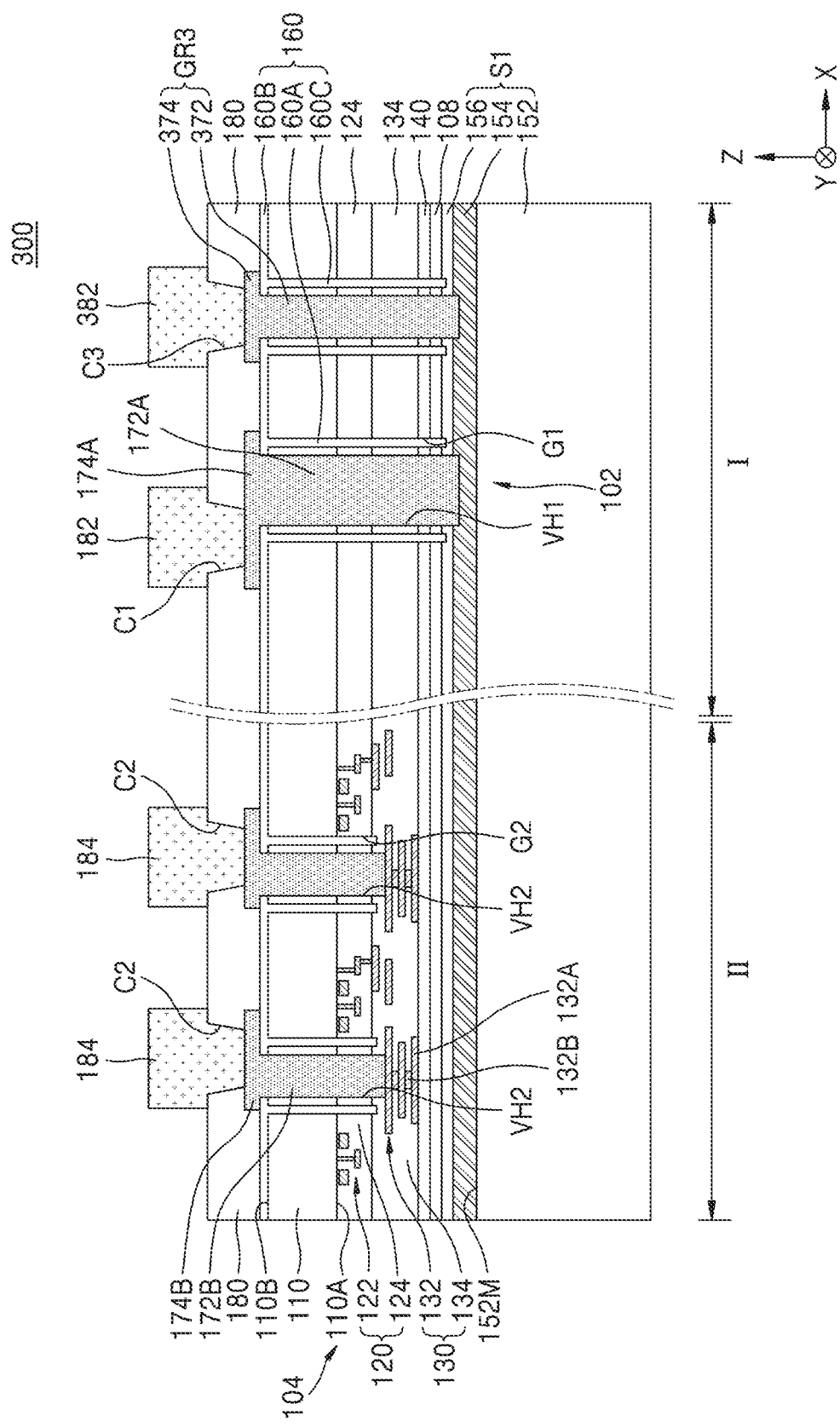

FIG. 3 is a cross-sectional view of a portion of an integrated circuit chip 300 according to some example embodiments of the inventive concepts.

Referring to FIG. 3, the integrated circuit chip 300 may have generally the same configuration as the integrated circuit chip 100 illustrated in FIG. 1. However, the integrated circuit chip 300 may further include a guard ring GR3 located in the edge region I and surrounding the integrated circuit device region II and the first penetrating electrode portion 172A in the X-Y plane (e.g., in a horizontal plane extending parallel to the active surface 110A of the first substrate 110).

The guard ring GR3 may include a third penetrating electrode portion 372 and a third pad portion 374. One end of the third penetrating electrode portion 372 may be in contact with the grounding conductive layer 154 and the other end of the third penetrating electrode portion 372 may be connected to the third pad portion 374. Accordingly, it will be understood that one end of the guard ring GR3 is in contact with the grounding conductive layer 154. The third penetrating electrode portion 372 and the third pad portion 374 may have generally the same configuration as that described for the first penetrating electrode portion 172A and the first pad portion 174A with reference to FIG. 1. However, the third penetrating electrode portion 372 may have a ring-shaped planar structure surrounding the integrated circuit device region II and the first penetrating electrode portion 172A. The third penetrating electrode portion 372 and the third pad portion 374 may be formed simultaneously with the first penetrating electrode portion 172A and the first pad portion 174A.

The insulating film 160 may further include a penetrating insulating portion 160C surrounding at least a portion of the third penetrating electrode portion 372 at a position spaced apart from the third penetrating electrode portion 372 in the horizontal direction. The penetrating insulating portion 160C may have generally the same configuration as that described for the plurality of penetrating insulating portions 160A with reference to FIG. 1. The penetrating insulating portion 160C may be formed simultaneously with the plurality of penetrating insulating portions 160A.

The integrated circuit chip 300 may further include a third connection terminal 382 formed on the second passivation film 180 in the edge region I. The third connection terminal 382 may be connected to the third pad portion 374 through a third contact hole C3 formed in the second passivation film 180 in the edge region I. The third connection terminal 382 may be formed simultaneously with the first connection terminal 182. In some example embodiments, the third connection terminal 382 may be made of ("may at least partially comprise") gold bump.

In the integrated circuit chip 300, the guard ring GR3 may serve to protect circuits and interconnection structures formed in the edge region I and the integrated circuit device region II. In some example embodiments, the guard ring GR3 may function as a crack stopper to protect the circuits and interconnect structures formed in the edge region I and the integrated circuit device region II from being physically damaged. In some other embodiments, the guard ring GR3 may perform a moisture blocking function to protect the circuits and interconnection structures formed in the edge region I and the integrated circuit device region II from moisture. In some other embodiments, the guard ring GR3 may perform an electrostatic discharge (ESD) function that may block abrupt surges in the circuits and interconnection structures formed in the edge region I and the integrated circuit device region II.

Figure 4:
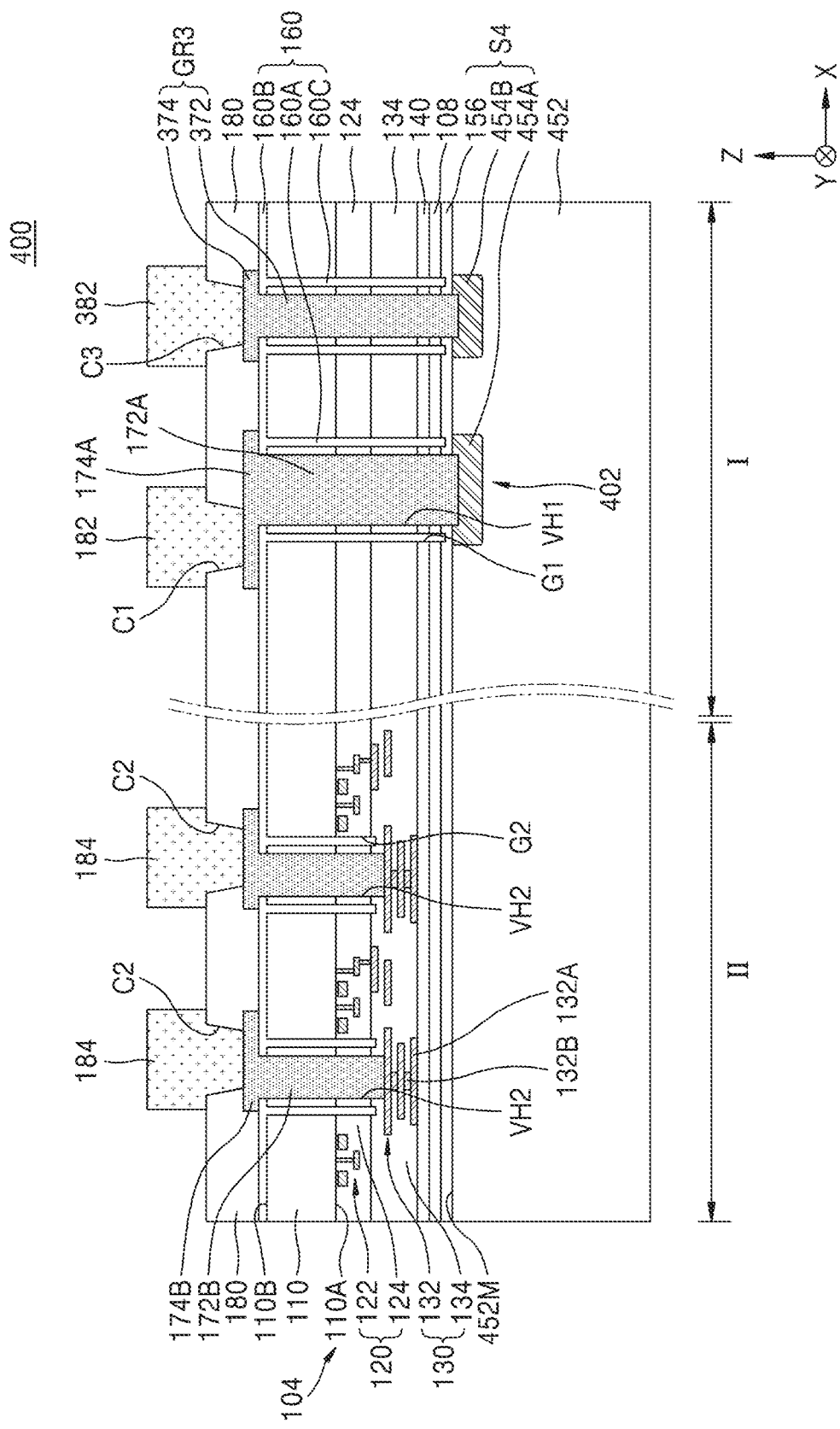

FIG. 4 is a cross-sectional view of a portion of an integrated circuit chip 400 according to some example embodiments of the inventive concepts.

Referring to FIG. 4, the integrated circuit chip 400 may have generally the same configuration as the integrated circuit chip 300 illustrated in FIG. 3. However, the integrated circuit chip 400 may include a grounding structure S4 instead of the grounding structure S1 illustrated in FIG. 3. The grounding structure S4 may include a second substrate 452, a plurality of grounding conductive layers 454A and 454B each formed in a local region of the second substrate 452 in the edge region I and the insulating film 156 covering a main surface 452M of the second substrate 452 and the grounding conductive layer 454A and 454B.

The detailed configuration of the second substrate 452 is generally similar to that described for the first substrate 110 with reference to FIG. 1. However, the main surface 452M of the second substrate 452 may be in contact with the insulating film 156.

The plurality of grounding conductive layers 454A and 454B may be obtained by implanting impurity ions into a portion of the second substrate 452 and may be formed of a semiconductor layer having a higher impurity ion concentration than other portions of the second substrate 452. In some example embodiments, the plurality of grounding conductive layers 454A and 454B may include a P++ type ion implanted region or an N++ type ion implanted region. For example, the plurality of grounding conductive layers 454A and 454B may be made of ("may at least partially comprise") an ion-implanted region doped with boron, respectively.

One end of the first penetrating electrode portion 172A may be in contact with the grounding conductive layer 454A in the edge region I and one end of the third penetrating electrode portion 372 may be in contact with the grounding conductive layer 454B. The grounding conductive layer 454B may have a ring-shaped planar structure corresponding to the planar shape of the third penetrating electrode portion 372. The plurality of grounding conductive layers 454A and 454B may not be formed in the integrated circuit device region II so as not to overlap vertically with the integrated circuit portion 122 but may be locally formed only in the edge region I.

In the edge region I, the grounding conductive layer 454A and the first penetrating electrode portion 172A may constitute an electromagnetic shielding structure 402. The grounding conductive layer 454A, the first penetrating electrode portion 172A, and the first pad portion 174A may provide a conductive path for electromagnetic shielding of the integrated circuit chip 400.

Figure 5:
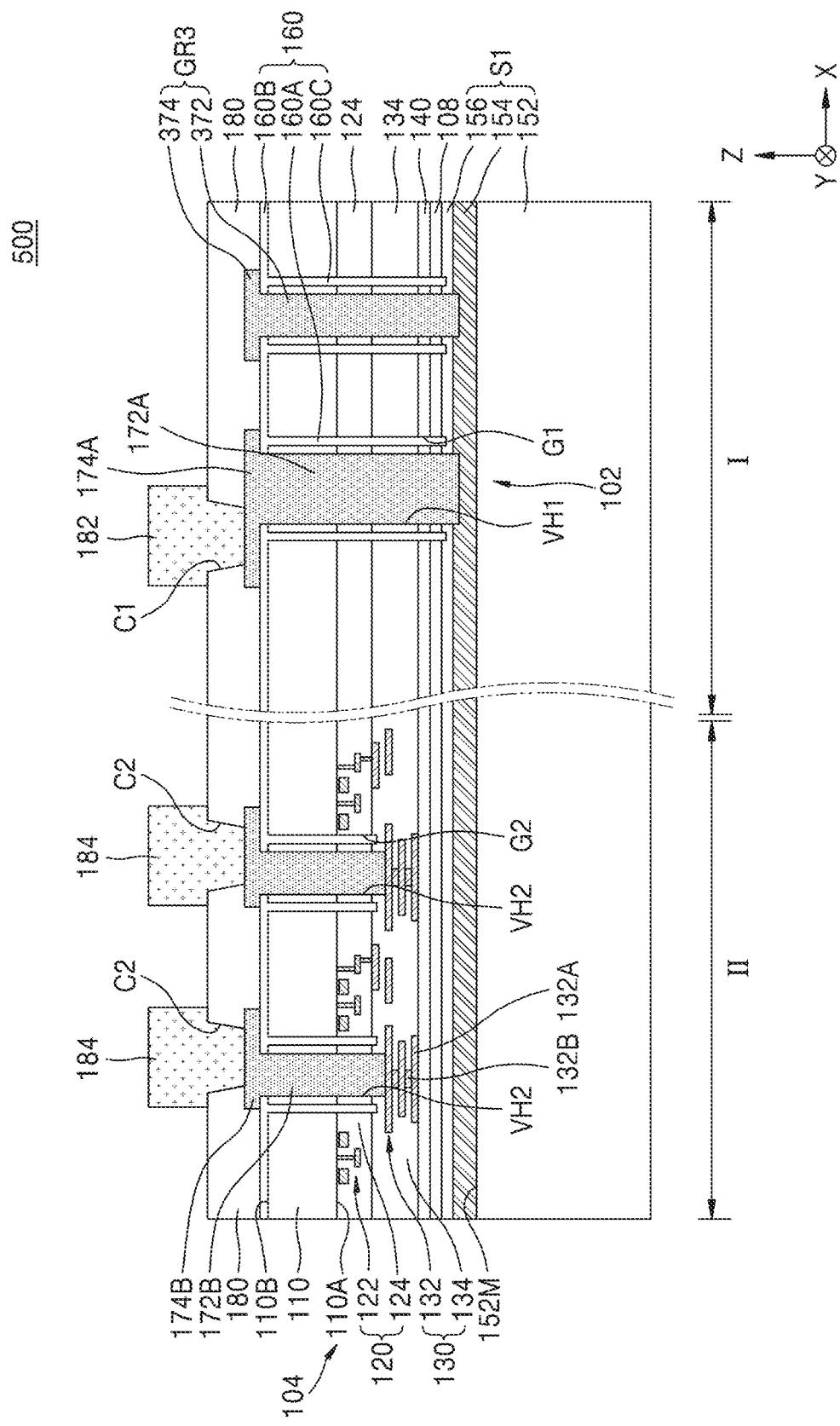

FIG. 5 is a cross-sectional view of a portion of an integrated circuit chip 500 according to some example embodiments of the inventive concepts.

Referring to FIG. 5, the integrated circuit chip 500 may have generally the same configuration as the integrated circuit chip 300 illustrated in FIG. 3. However, the integrated circuit chip 500 does not include the third connection terminal 382 connected to the guard ring GR3 in the edge region I. The third pad portion 374 of the guard ring GR3 may be covered with the second passivation film 180. The guard ring GR3 may not receive a voltage from an outside of the integrated circuit chip 500.

Figure 6:
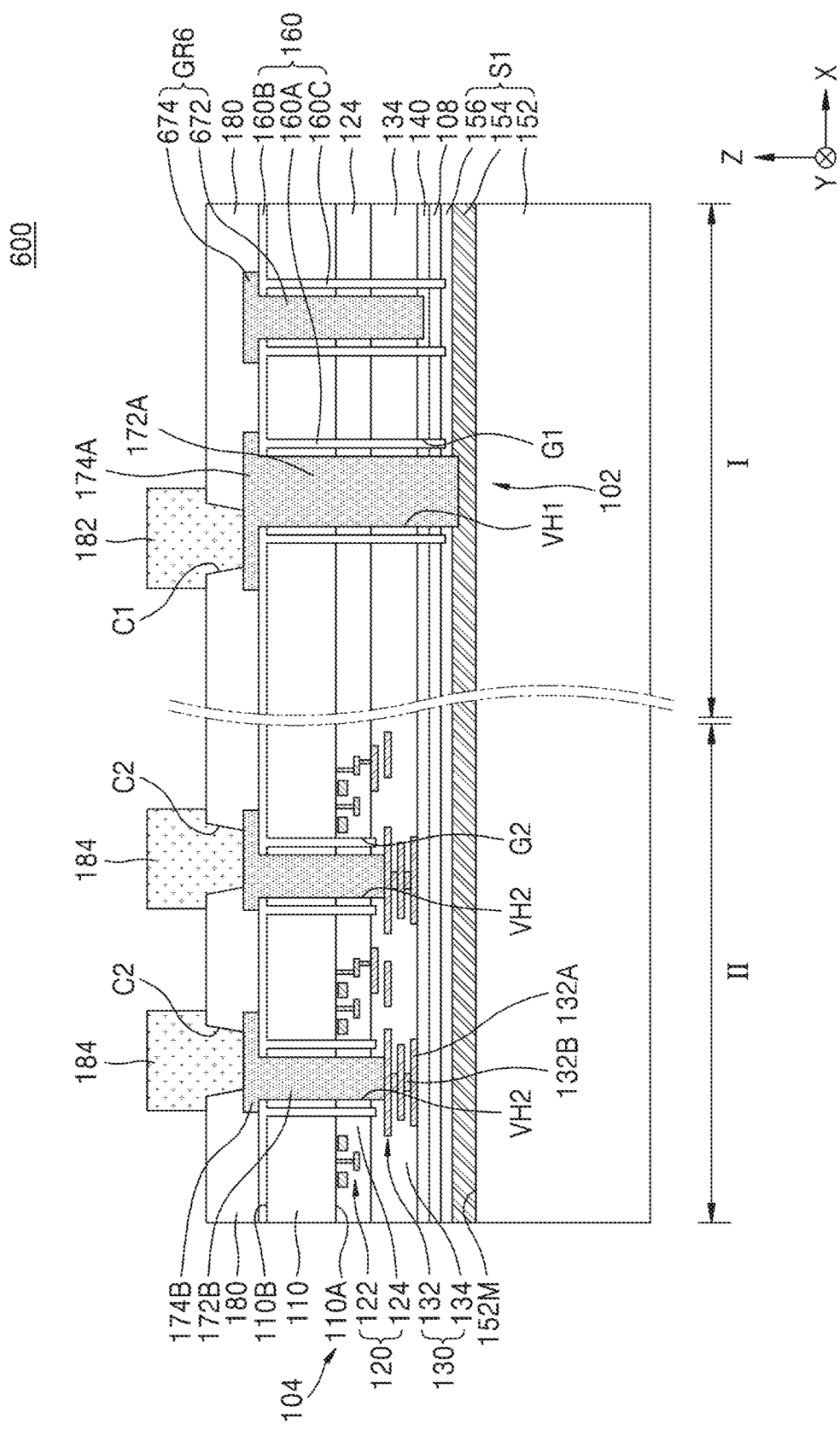

FIG. 6 is a cross-sectional view of a portion of an integrated circuit chip 600 according to some example embodiments of the inventive concepts.

Referring to FIG. 6, the integrated circuit chip 600 may have generally the same configuration as the integrated circuit chip 500 illustrated in FIG. 5. However, the integrated circuit chip 600 may include a guard ring GR6 instead of the guard ring GR3. The guard ring GR6 may include a third penetrating electrode portion 672 disposed in the edge region I and having a ring-shaped planar structure surrounding the integrated circuit device region II and the first penetrating electrode portion 172A, and a third pad portion 674 connected to the third penetrating electrode portion 672. The third pad portion 674 of the guard ring GR6 may be covered with the second passivation film 180. The guard ring GR6 may not receive a voltage from the outside of the integrated circuit chip 600. In some example embodiments, the third pad portion 674 may be omitted. The third penetrating electrode portion 672 may be spaced apart from the grounding conductive layer 154 in the vertical direction (the Z direction) with the bonding layer 108 and the insulating film 156 therebetween. Restated, and as shown in FIG. 6, the guard ring GR6 may be isolated from direct contact with the grounding conductive layer 154 in a vertical direction extending perpendicular to the active surface 110A of the first substrate 110. The constituent materials of the third penetrating electrode portion 672 and the third pad portion 674 may be generally the same as those described for the first penetrating electrode portion 172A and the first pad portion 174A with reference to FIG. 1.

In the integrated circuit chip 600, the guard ring GR6 may function as a crack stopper for protecting the circuits and the interconnection structures formed in the edge region I and the integrated circuit device region II from being physically damaged, or may function as a moisture blocking for protecting the circuits and the interconnection structures formed in the edge region I and the integrated circuit device region II from the moisture.

Figure 7:
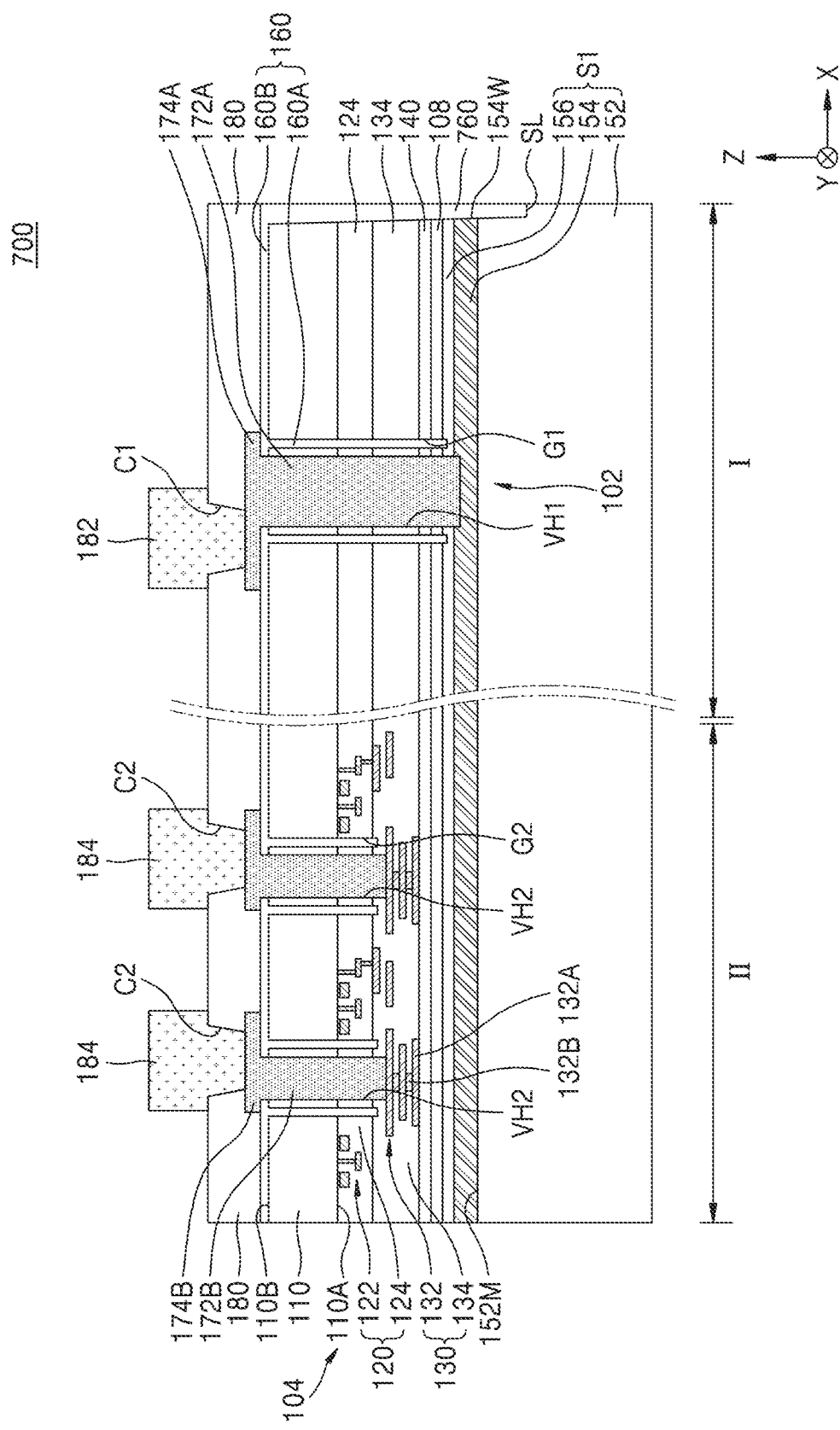

FIG. 7 is a cross-sectional view of a portion of an integrated circuit chip 700 according to some example embodiments of the inventive concepts.

Referring to FIG. 7, the integrated circuit chip 700 may have generally the same configuration as the integrated circuit chip 100 illustrated in FIG. 1. However, as shown in FIG. 7, the integrated circuit chip 700 may further include an insulating protective film 760 covering a sidewall 154W of the grounding conductive layer 154 facing the outside of the integrated circuit chip 700 in the edge region I.

The insulating protective film 760 may be elongated in the vertical direction (the Z direction) along the sidewalls of the first substrate 110, the FEOL structure 120, the BEOL structure 130, the bonding layer 108, and the insulating film 156, respectively. Accordingly, as shown in FIG. 7, the insulating protective film 760 extends in the vertical direction extending perpendicular to the active surface 110A of the first substrate 110 to cover a sidewall of the first substrate 110, a sidewall of the FEOL structure 120, a sidewall of the BEOL structure 130, and a sidewall of the bonding layer 108. The insulating protective film 760 may be integrally connected to the insulating liner portion 160B of the insulating film 160. The insulating protective film 760 may be formed to fill a slit SL formed at the outermost edge of the integrated circuit chip 700. Due to the slit SL formed at the outermost edge of the integrated circuit chip 700, the sidewall 154W of the grounding conductive layer 154 may be further recessed into the inside of the integrated circuit chip 700 along the horizontal direction from a sidewall of the second substrate 152 at the outermost edge of the integrated circuit chip 700 exposed in the edge region I.

The insulating protective film 760 and the bonding layer 108 may be made of ("may at least partially comprise") different materials (e.g., may include different total material compositions). The insulating protective film 760 may be made of ("may at least partially comprise") the same material as the insulating film 160. For example, the insulating protective film 760 may include an aluminum oxide film or a hafnium oxide film. In some example embodiments, at least a portion of the insulating protective film 760 may include an air gap.

The insulating protective film 760 may be formed simultaneously with the insulating film 160. Therefore, even if an etchant such as aqua regia (a mixed solution of nitric acid, hydrochloric acid, and pure water) is used during formation of the first connection terminal 182 and the plurality of second connection terminals 184 on the second passivation film 180, there is no possibility that the sidewall 154W of the grounding conductive layer 154 is exposed to the etchant from the outside of the integrated circuit chip 700. Therefore, corrosion of the grounding conductive layer 154 during the manufacturing process of the integrated circuit chip 700 may be prevented.

Figure 8:
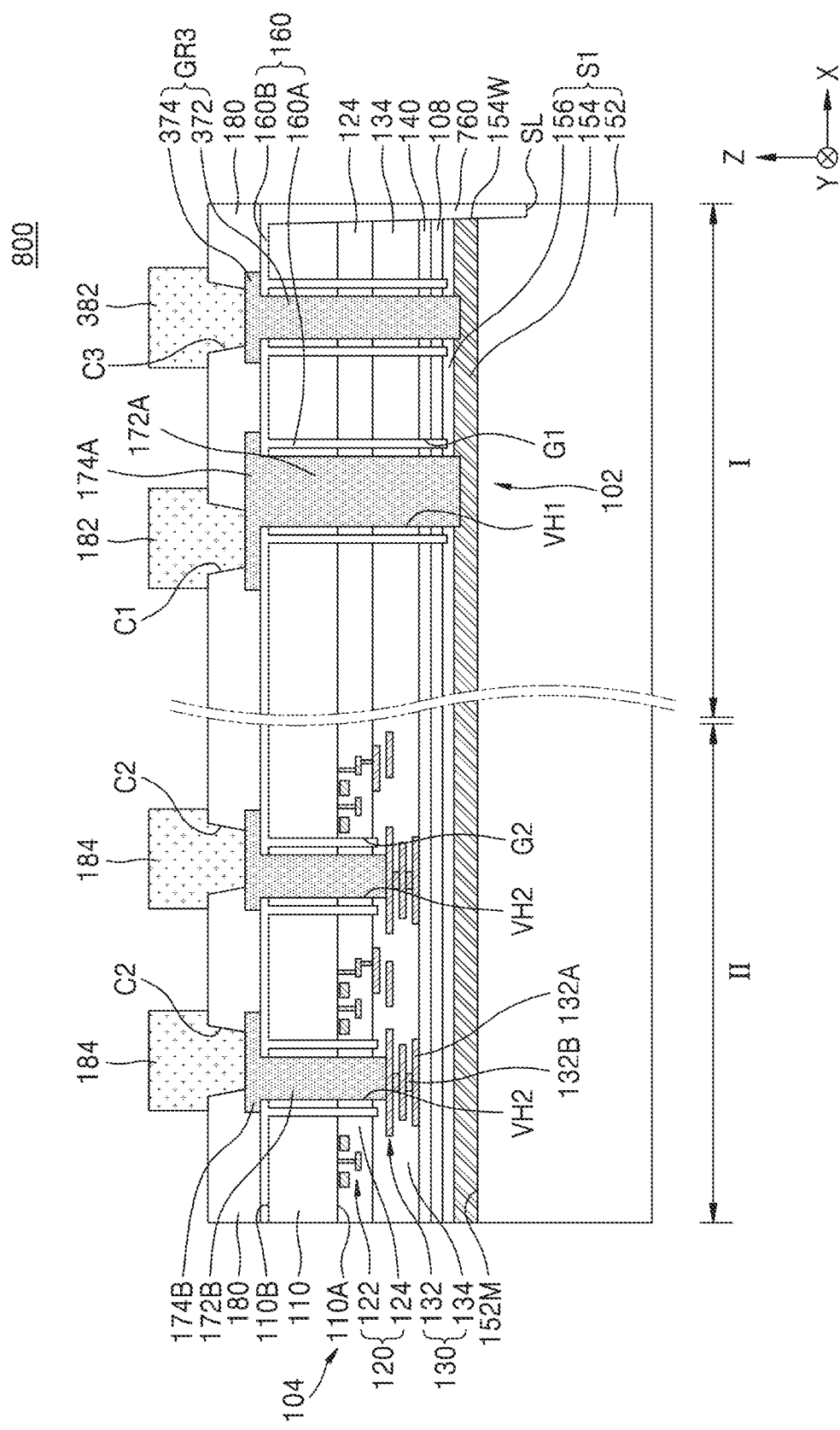

FIG. 8 is a cross-sectional view of a portion of an integrated circuit chip 800 according to some example embodiments of the inventive concepts.

Referring to FIG. 8, the integrated circuit chip 800 may have generally the same configuration as the integrated circuit chip 300 illustrated in FIG. 3. However, the integrated circuit chip 800 may further include an insulating protective film 760 covering the sidewall 154W of the grounding conductive layer 154 facing the outside of the integrated circuit chip 800 in the edge region I. A more detailed configuration and effect for the insulating protective film 760 are the same as that described with reference to FIG. 7.

Figure 9:
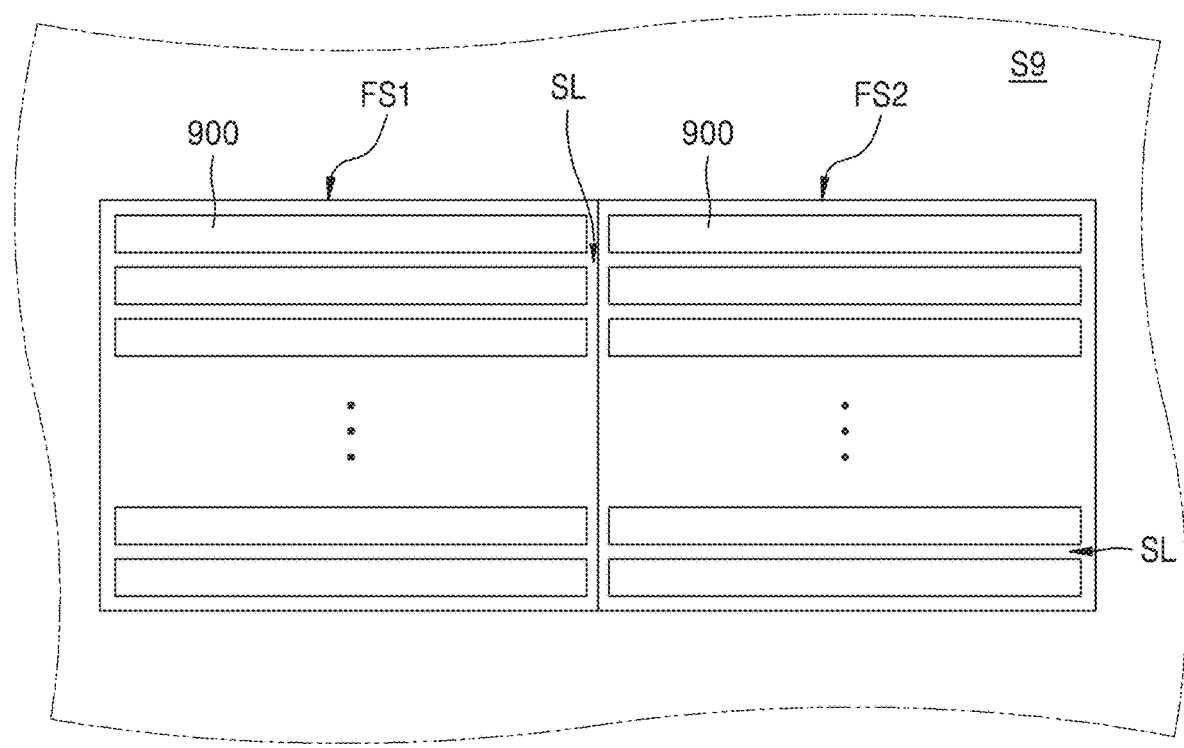
FIG. 9 is a schematic plan view of a plurality of integrated circuit chips according to some example embodiments of the inventive concepts.

FIG. 9 is a schematic plan view of a plurality of integrated circuit chips according to some example embodiments of the inventive concepts. FIG. 9 illustrates a plurality of integrated circuit chips 900 included in two full-shots FS1 and FS2 among the plurality of integrated circuit chips 900 formed on a grounding structure S9. The plurality of integrated circuit chips 900 in FIG. 9 are in a state before they are separated and individualized from each other by a sawing process. The plurality of integrated circuit chips 900 may each have the same or similar structure as any one integrated circuit chip from among the integrated circuit chips 100, 200, 300, 400, 500, 600, 700, 800 illustrated in FIGS. 1 to 8. The plurality of integrated circuit chips 900 may each include a portion of the grounding structure S9. Portions included in the plurality of integrated circuit chips 900 in the grounding structure S9 may have the same or similar structure as any one grounding structure from among the grounding structures S1, S2, and S4 illustrated in FIGS. 1 to 8.

The plurality of integrated circuit chips 900 may be spaced apart from each other with a scribe lane SL therebetween. The plurality of integrated circuit chips 900 may be included in each of the full shots FS1 and FS2. The plurality of integrated circuit chips 900 may include memory chips or non-memory chips, respectively. In some example embodiments, the plurality of integrated circuit chips 900 may each constitute a display driver IC (DDI) chip.

Figure 10A:
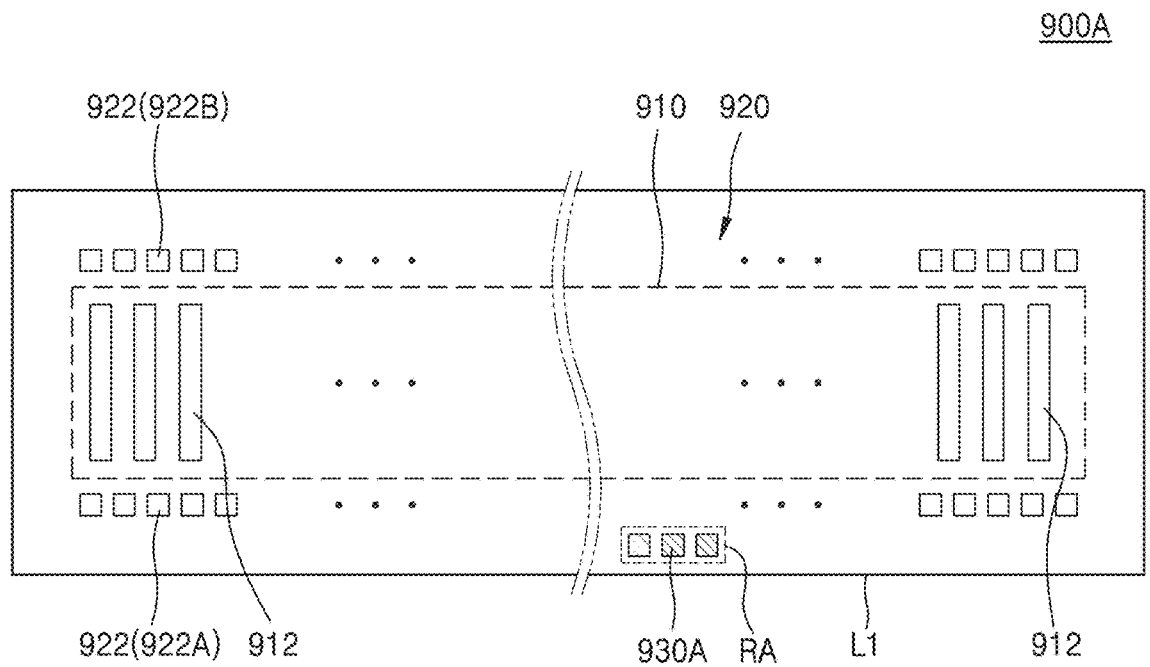
FIGS. 10A, 10B, 10C, 10D, 10E, 10F, 10G, and 10H are plan views showing an example configuration of an integrated circuit chip according to some example embodiments of the inventive concepts.

FIG. 10A is a plan view showing an example configuration of an integrated circuit chip 900A according to some example embodiments of the inventive concepts.

Referring to FIG. 10A, the integrated circuit chip 900A may constitute at least a part of the plurality of integrated circuit chips 900 illustrated in FIG. 9. The integrated circuit chip 900A may include a circuit region 910 and a peripheral region 920 arranged around the circuit region 910. In FIG. 10A, the boundary between the circuit region 910 and the peripheral region 920 is represented by a dotted line for the sake of convenience, but the boundary between the circuit region 910 and the peripheral region 920 may not be physically distinguished. The circuit region 910 and the peripheral region 920 may correspond to the integrated circuit device region II of the integrated circuit chips 100, 200, 300, 400, 500, 600, 700, 800 illustrated in FIGS. 1 to 8.

In the circuit region 910, a plurality of driver circuit cells 912 and a plurality of interconnection patterns (not shown) may be arranged. A plurality of electrode pads 922 may be formed in the peripheral region 920. The plurality of electrode pads 922 may include a plurality of input electrode pads 922A and a plurality of output electrode pads 922B. Each of the plurality of driver circuit cells 912 may be electrically connected to the plurality of electrode pads 922 through the plurality of interconnection patterns. The plurality of driver circuit cells 912 may generate data signals for driving a display panel, for example, a display panel 2300 illustrated in FIG. 12, and output them to the output electrode pad 922B, in response to driving control signals and a power supply signal applied through the input electrode pad 922A from an external device, for example, an external printed circuit board. The plurality of driver circuit cells 912 may include a shift register, a data register, a line latch unit, a digital-analog conversion unit, an output buffer unit, and the like, but are not limited thereto.

The plurality of input electrode pads 922A together with input connection terminals may constitute an input part of the integrated circuit chip 900A, and the plurality of output electrode pads 922B together with output connection terminals may constitute an output part of the integrated circuit chip 900A. In some example embodiments, each of the input connection terminals and the output connection terminals may be selected from among the plurality of second connection terminals 184 illustrated in FIGS. 1 to 8.

The integrated circuit chip 900A may have an electromagnetic shielding contact region RA including an electromagnetic shielding structure 930A. The electromagnetic shielding contact region RA may be a part of the edge region I of the integrated circuit chips 100, 200, 300, 400, 500, 600, 700, 800 illustrated in FIGS. 1 to 8. The electromagnetic shielding structure 930A may be any one of the electromagnetic shielding structures 102, 202, and 402 illustrated in FIGS. 1 to 8. FIG. 10A illustrates a case where three electromagnetic shielding structures 930A having an island-shaped planar structure are included in the electromagnetic shielding contact region RA, but this is merely an example, and one or more electromagnetic shielding structures 930A may be included. The electromagnetic shielding contact region RA may be arranged adjacent to an edge of a long side L1 of the integrated circuit chip 900A, and the plurality of electromagnetic shielding structures 930A may be arranged in a line along the longitudinal direction of the long side L1.

Figure 10B:
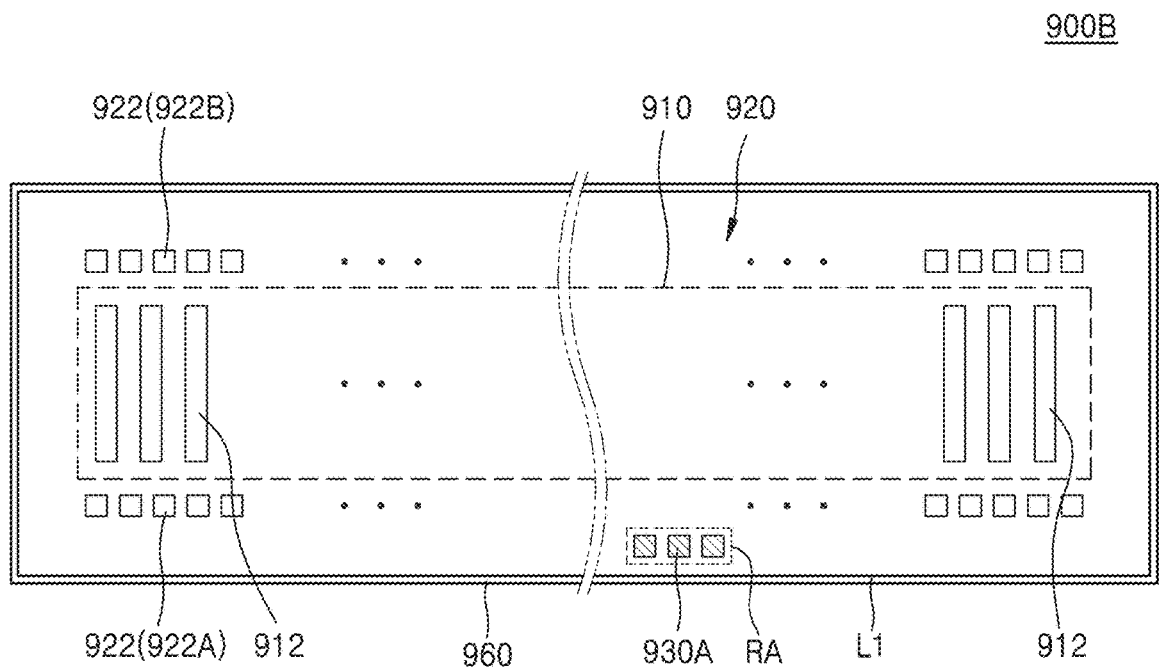

FIG. 10B is a plan view showing an example configuration of an integrated circuit chip 900B according to some example embodiments of the inventive concepts.

Referring to FIG. 10B, the integrated circuit chip 900B may constitute at least a part of the plurality of integrated circuit chips 900 illustrated in FIG. 9. The integrated circuit chip 900B may have generally the same configuration as the integrated circuit chip 900A illustrated in FIG. 10A. However, the integrated circuit chip 900B may further include an insulating protective film 960 that covers a sidewall of the outermost edge of the peripheral region 920 at the outside of the peripheral region 920 of the integrated circuit chip 900B. The detailed configuration and effect for the insulating protective film 960 are the same as those described for the insulating protective film 760 with reference to FIG. 7.

Figure 10C:
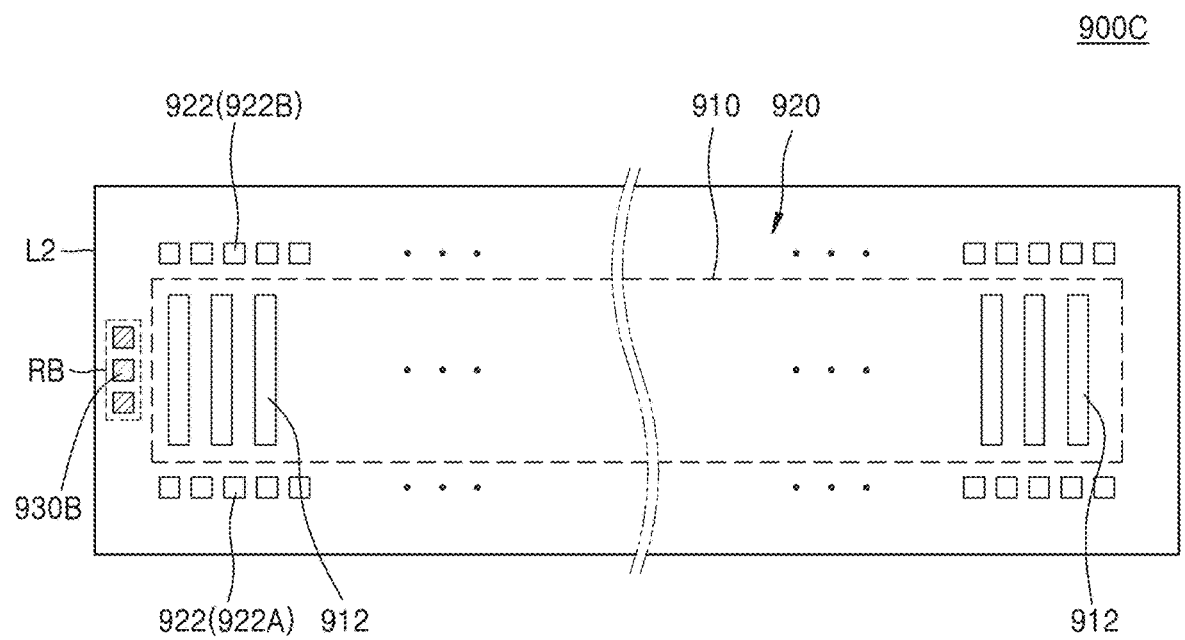

FIG. 10C is a plan view showing an example configuration of an integrated circuit chip 900C according to some example embodiments of the inventive concepts.

Referring to FIG. 10C, the integrated circuit chip 900C may constitute at least a part of the plurality of integrated circuit chips 900 illustrated in FIG. 9. The integrated circuit chip 900C may have generally the same configuration as the integrated circuit chip 900A illustrated in FIG. 10A. However, the integrated circuit chip 900C may have the electromagnetic shielding contact region RB including the electromagnetic shielding structure 930B. The electromagnetic shielding contact region RB may be a part of the edge region I of the integrated circuit chips 100, 200, 300, 400, 500, 600, 700, 800 illustrated in FIGS. 1 to 8. The electromagnetic shielding structure 930B may be one of the electromagnetic shielding structures 102, 202, and 402 illustrated in FIGS. 1 to 8. FIG. 10C illustrates a case where three electromagnetic shielding structures 930B having an island-shaped planar structure are included in the electromagnetic shielding contact region RB, but this is merely an example, and one or more electromagnetic shielding structure 930B may be included. The electromagnetic shielding contact region RB may be arranged adjacent to an edge of a short side L2 of the integrated circuit chip 900C and the plurality of electromagnetic shielding structures 930B may be arranged in a line along the longitudinal direction of the short side L2.

Figure 10D:
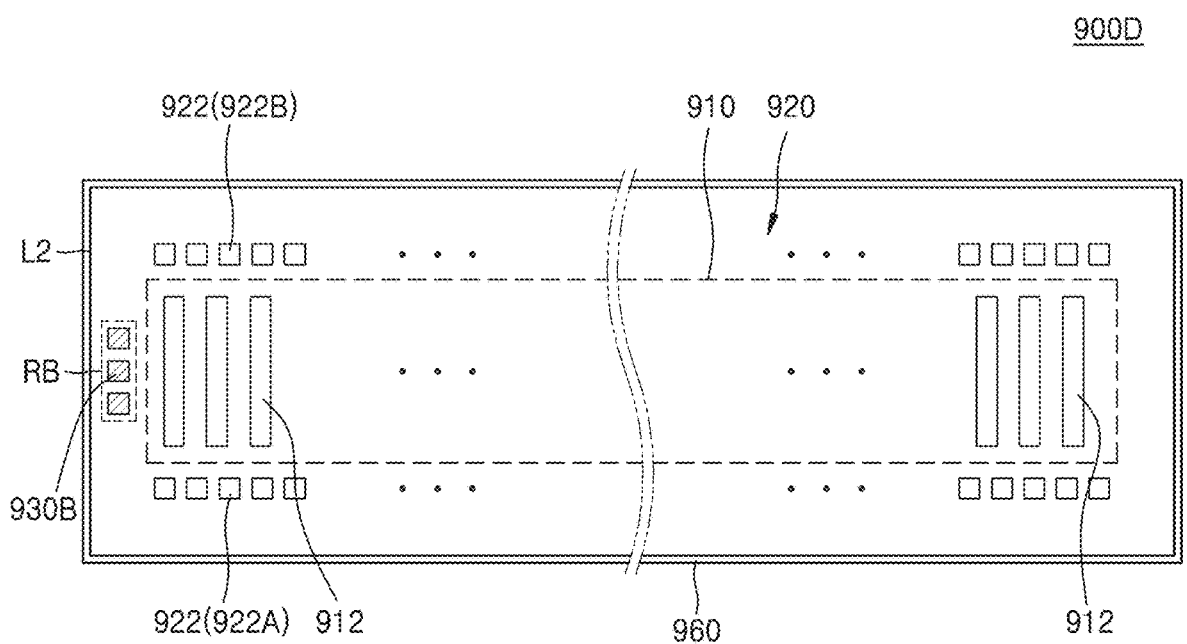

FIG. 10D is a plan view showing an example configuration of an integrated circuit chip 900D according to some example embodiments of the inventive concepts.

Referring to FIG. 10D, the integrated circuit chip 900D may constitute at least a part of the plurality of integrated circuit chips 900 illustrated in FIG. 9. The integrated circuit chip 900D may have generally the same configuration as the integrated circuit chip 900C illustrated in FIG. 10C. However, the integrated circuit chip 900D may further include an insulating protective film 960 covering the sidewall of the outermost edge of the peripheral region 920.

Figure 10E:
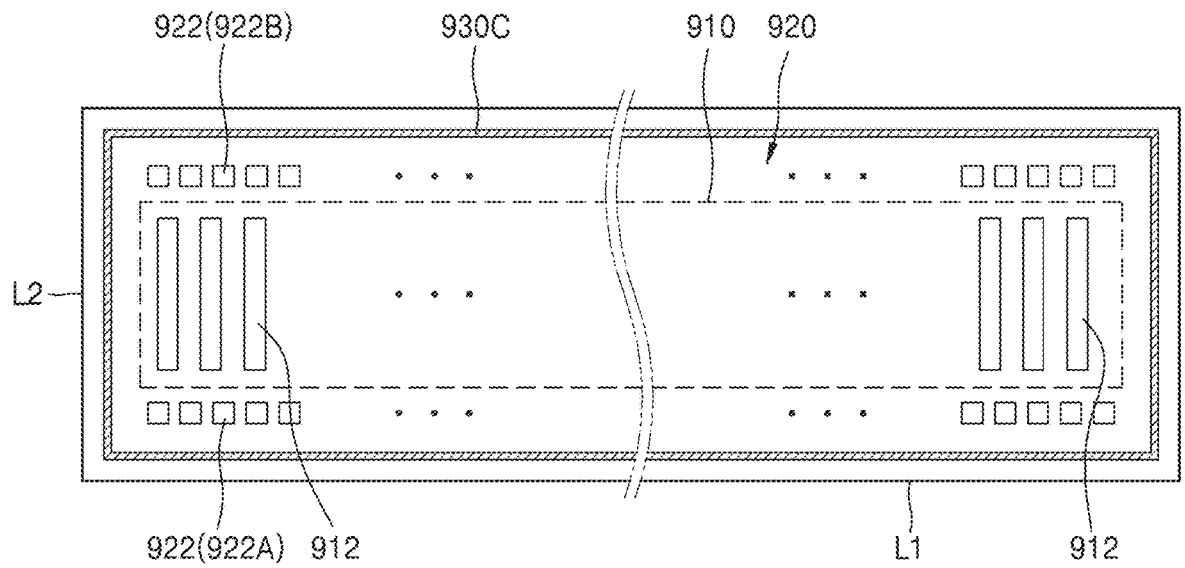

FIG. 10E is a plan view showing an example configuration of an integrated circuit chip 900E according to some example embodiments of the inventive concepts.

Referring to FIG. 10E, the integrated circuit chip 900E may constitute at least a part of the plurality of integrated circuit chips 900 illustrated in FIG. 9. The integrated circuit chip 900E may have generally the same configuration as the integrated circuit chip 900A illustrated in FIG. 10A. However, the integrated circuit chip 900E may include an electromagnetic shielding structure 930C having a ring-shaped planar structure.

The electromagnetic shielding structure 930C may be arranged adjacent to an edge of the integrated circuit chip 900E to surround the circuit region 910 and the peripheral region 920, and may be extended in the longitudinal direction of each of a long side L1 and a short side L2. The electromagnetic shielding structure 930C may have a cross-sectional structure of one of the electromagnetic shielding structures 102, 202, and 402 illustrated in FIGS. 1 to 8.

In some example embodiments, the electromagnetic shielding structure 930C may function as a crack stopper to protect the circuits and the interconnection structures formed in the circuit region 910 and the peripheral region 920 from being physically damaged, a moisture blocking to protect the circuits and the interconnection structures formed in the circuit region 910 and the peripheral region 920 from the moisture, or an ESD to block abrupt surges in the circuits and the interconnection structures formed in the circuit region 910 and the peripheral region 920.

Figure 10F:
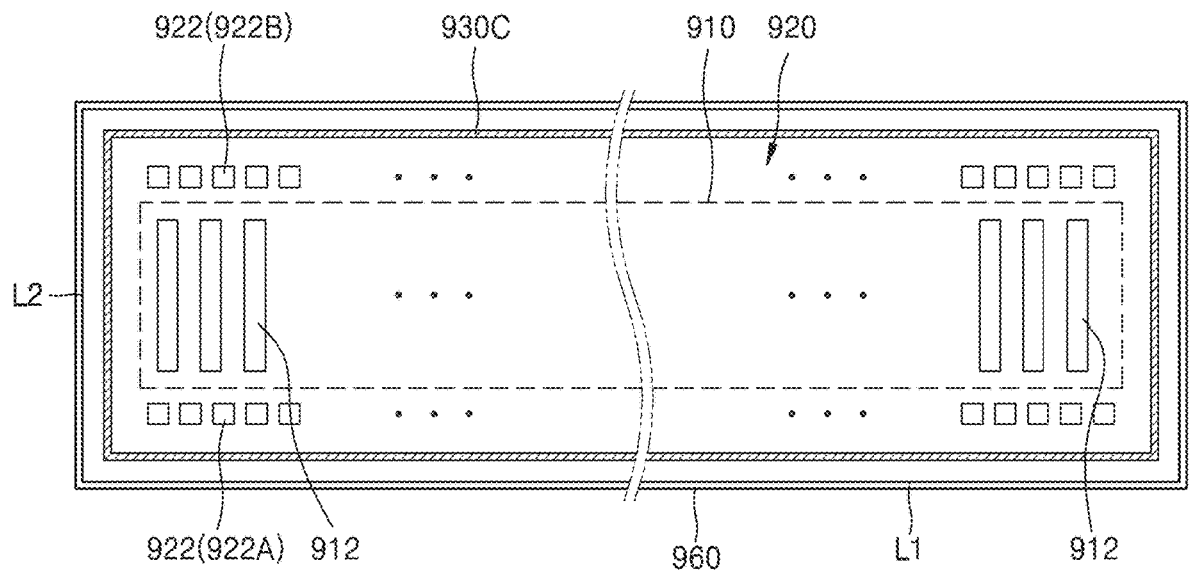

FIG. 10F is a plan view showing an example configuration of an integrated circuit chip 900F according to some example embodiments of the inventive concepts.

Referring to FIG. 10F, the integrated circuit chip 900F may constitute at least a part of the plurality of integrated circuit chips 900 illustrated in FIG. 9. The integrated circuit chip 900F may have substantially the same configuration as the integrated circuit chip 900E illustrated in FIG. 10E. However, the integrated circuit chip 900F may further include an insulating protective film 960 covering the sidewall of the outermost edge of the peripheral region 920.

Figure 10G:
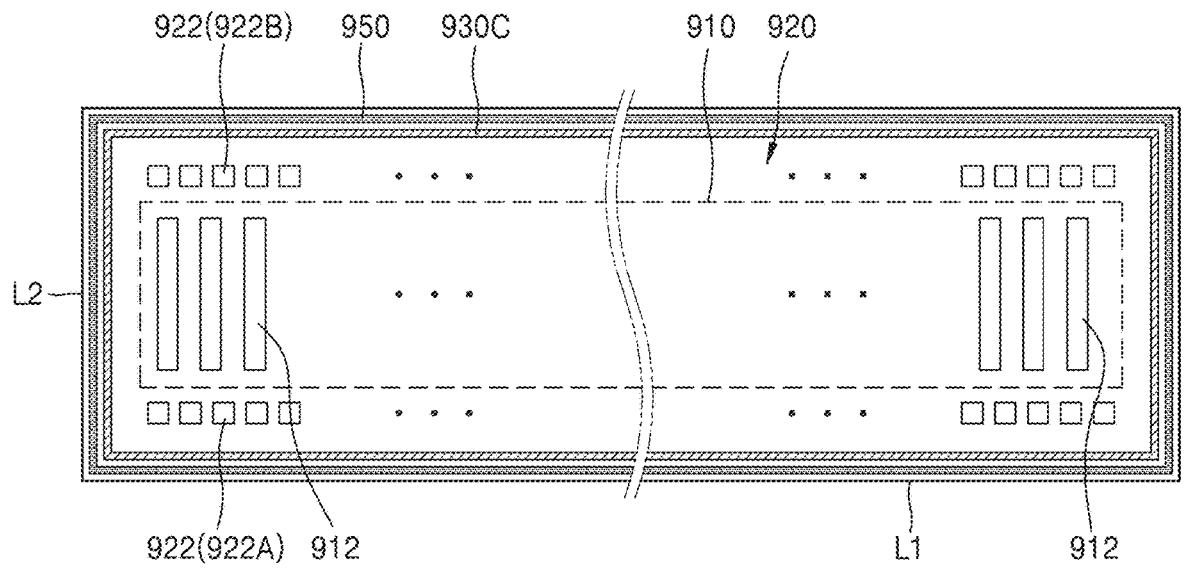

FIG. 10G is a plan view showing an example configuration of an integrated circuit chip 900G according to some example embodiments of the inventive concepts.

Referring to FIG. 10G, the integrated circuit chip 900G may constitute at least a part of the plurality of integrated circuit chips 900 illustrated in FIG. 9. The integrated circuit chip 900G may have generally the same configuration as the integrated circuit chip 900E illustrated in FIG. 10E. However, the integrated circuit chip 900G may further include a guard ring 950 arranged between an edge of the integrated circuit chip 900G and the electromagnetic shielding structure 930C.

The guard ring 950 may be made of ("may at least partially comprise") a conductor for protecting the circuits and the interconnection structures formed in the circuit regions 910 and the peripheral regions 920 and protecting the electromagnetic shielding structure 930C. For example, the guard ring 950 may include a single-layer or multi-layer structure of a metal film.

In some example embodiments, the guard ring 950 may have the same or similar cross-sectional structure as one of the guard rings selected from the guard rings GR3 and GR6 illustrated in FIGS. 3 to 6 and 8.

The guard ring 950 may function as a crack stopper for protecting the circuits and the interconnection structures formed in the circuit region 910 and the peripheral region 920 and the electromagnetic shielding structure 930C from being physically damaged. In some example embodiments, the guard ring 950 may function as a moisture blocking for protecting the circuits and the interconnection structures formed in the circuit region 910 and the peripheral region 920 and the electromagnetic shielding structure 930C from the moisture. In some example embodiments, the guard ring 950 may perform ESD function for blocking abrupt surges in the circuits and the interconnection structures formed in the circuit region 910 and the peripheral region 920 and the electromagnetic shielding structure 930C.

Figure 10H:
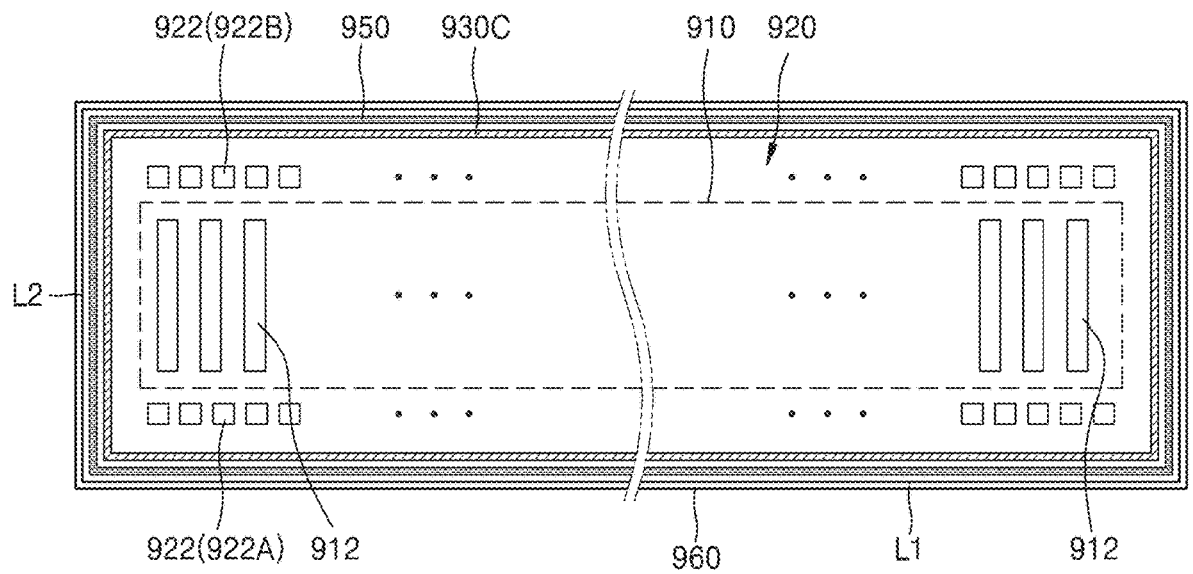

FIG. 10H is a plan view showing an example configuration of an integrated circuit chip 900H according to some example embodiments of the inventive concepts.

Referring to FIG. 10H, the integrated circuit chip 900H may constitute at least a part of the plurality of integrated circuit chips 900 illustrated in FIG. 9. The integrated circuit chip 900H may have generally the same configuration as the integrated circuit chip 900G illustrated in FIG. 10G. However, the integrated circuit chip 900H may further include the insulating protective film 960 covering the sidewall of the outermost edge of the peripheral region 920.

The integrated circuit chips 900A, 900B, 900C, 900D, 900E, 900F, 900G, and 900H described with reference to FIGS. 10A to 10H may each include the grounding conductive layer 154 formed entirely on the second substrate 152 along the main surface 152M of the second substrates 152 of the grounding structure 51 facing the active surface 110A of the first substrate 110 as shown in FIGS. 1, 3, and 5 to 8, the grounding conductive layer 254 formed locally around one end of the first penetrating electrode portion 172A in the second substrate 252 of the grounding structure S2 as shown in FIG. 2, and the grounding conductive layer 454A formed locally around one end of the first penetrating electrode portion 172A in the second substrate 452 of the grounding structure S4 as shown in FIG. 4.

One end of the guard ring 950 in the integrated circuit chips 900G and 900H illustrated in FIGS. 10G and 10H may be configured to be electrically connected to the grounding conductive layer 154 illustrated in FIGS. 1, 3 and 5 to 8, or the grounding conductive layer 454B illustrated in FIG. 4. In this case, by applying a ground voltage to the guard ring 950 and the electromagnetic shielding structure 930C in the integrated circuit chips 900G and 900H, the integrated circuit chips 900G and 900H may be protected from the instantaneous ESD introduced from the outside and/or the high current surge.

The integrated circuit chips 100, 200, 300, 400, 500, 600, 700, 800, 900, 900A, 900B, 900C, 900D, 900E, 900F, 900G, and 900H according to the inventive concepts may include the electromagnetic shielding structures 102, 202, and 402 for shielding EMI therein. Therefore, an integrated circuit package including the integrated circuit chip according to the inventive concepts does not need to form a separate shielding structure for shielding EMI at the outside of the integrated circuit chip. Accordingly, there is no need to secure a space for forming a separate shielding structure at the outside of the integrated circuit chip, and therefore it may be advantageously applied to a display apparatus using full front display (FFD).

Figure 11A:
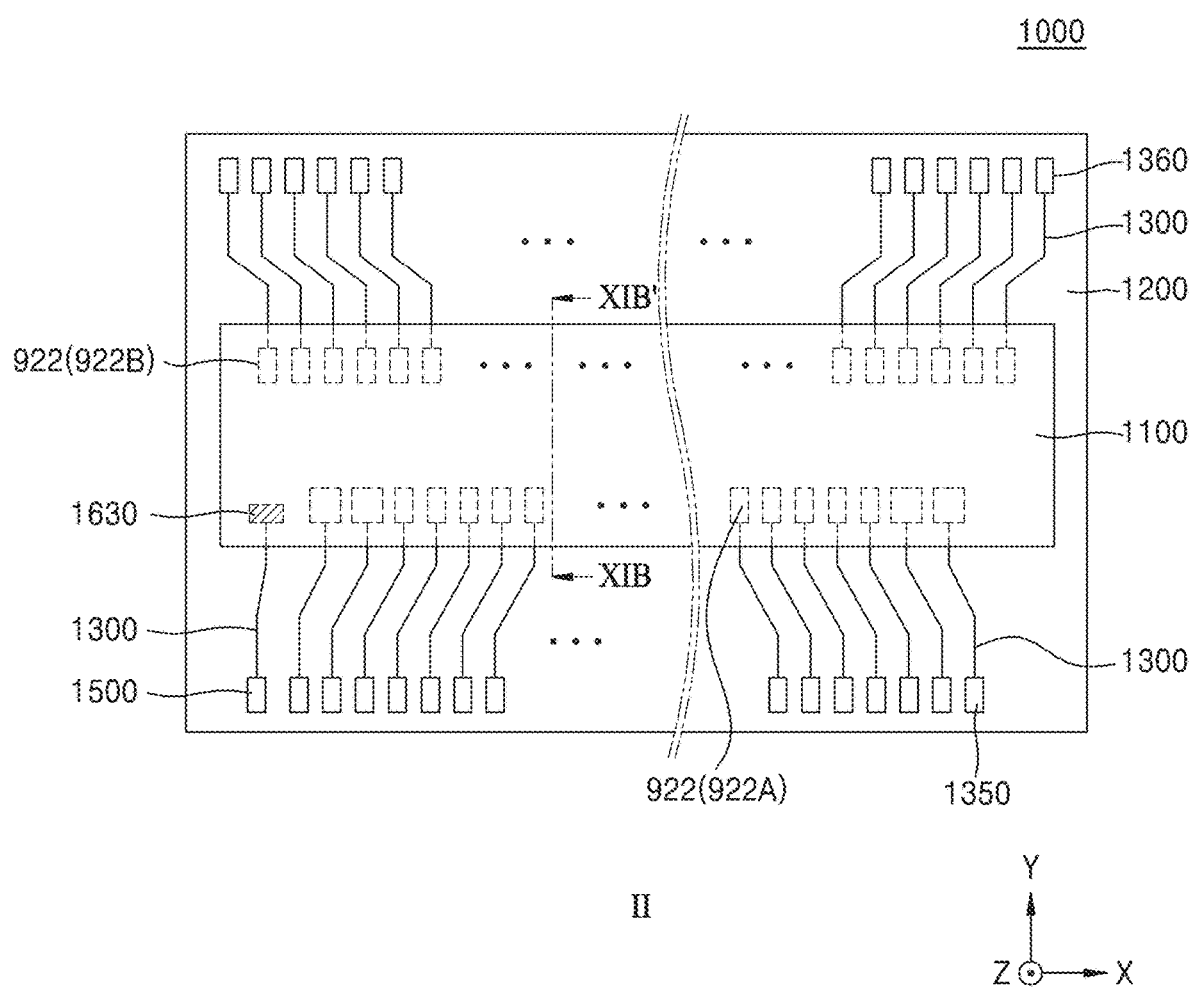
FIG. 11A is a schematic plan view of an integrated circuit package according to some example embodiments of the inventive concepts.
Figure 11B:
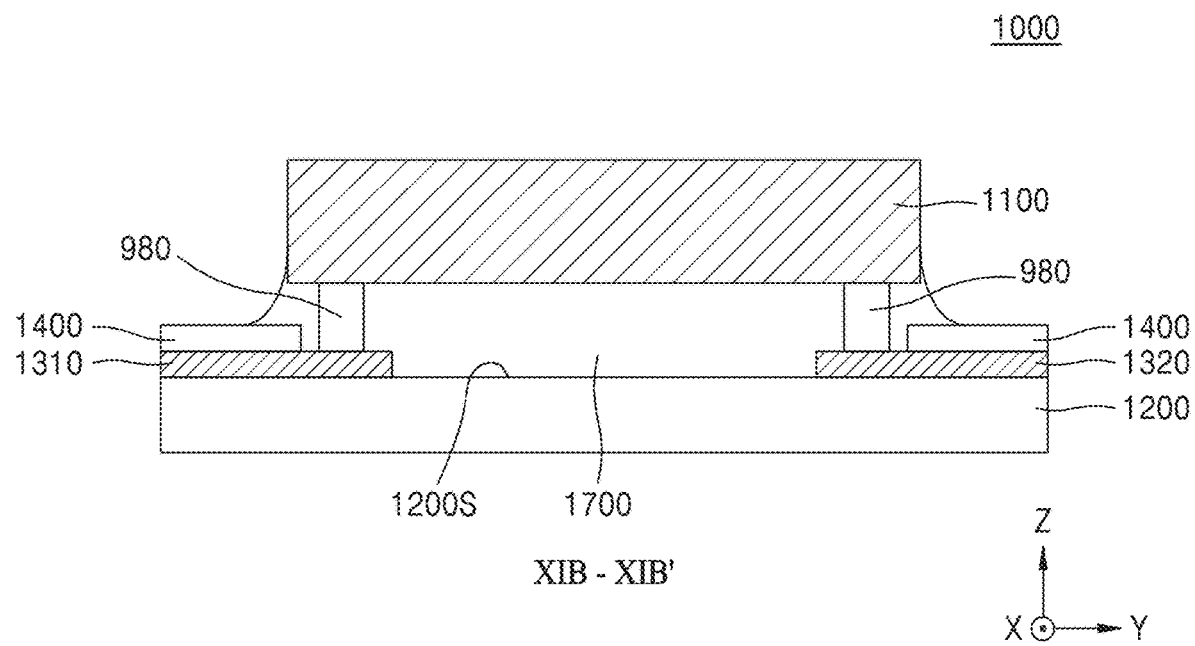
FIG. 11B is an enlarged cross-sectional view taken along line XIB-XIB' of FIG. 11A.

FIG. 11A is a schematic plan view of an integrated circuit package 1000 according to some example embodiments of the inventive concepts, and FIG. 11B is an enlarged cross-sectional view taken along line XIB-XIB' of FIG. 11A.

Referring to FIGS. 11A and 11B, the integrated circuit package 1000 may include an integrated circuit chip 1100 and a supporting substrate 1200 including a mounting surface 1200S on which the integrated circuit chip 1100 is mounted. The integrated circuit chip 1100 may be any of the integrated circuit chips described herein according to any of the example embodiments described herein.

Figure 12:
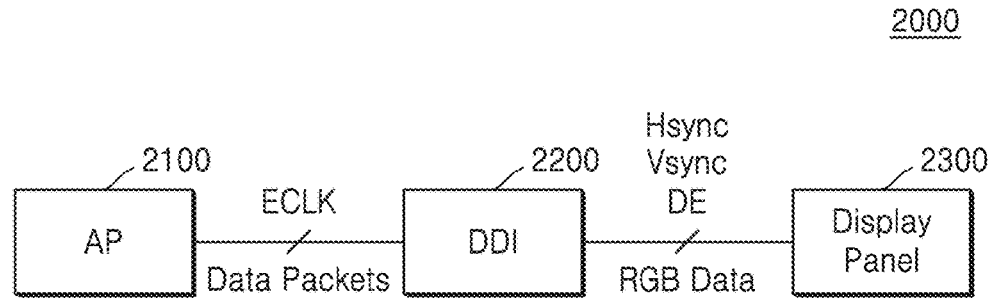
FIG. 12 is an example block diagram for explaining a display apparatus according to the inventive concepts.

In some example embodiments, the integrated circuit chip 1100 may be a source driving chip that receives a signal voltage from an external device, for example, an external printed circuit board, and generates an image signal, and outputs the image signal to a data line of a display panel, for example, a display panel 2300 illustrated in FIG. 12. In some example embodiments, the integrated circuit chip 1100 may be a gate driving chip that generates a scan signal including the on/off signal of a transistor and outputs the scan signal to a gate line of the display panel. The integrated circuit chip 1100 may have any one structure of the integrated circuit chips 100, 200, 300, 400, 500, 600, 700, 800, 900, 900A, 900B, 900C, 900D, 900E, 900F, 900G, and 900H.

In some example embodiments, the supporting substrate 1200 may be made of ("may at least partially comprise") a flexible film. For example, the supporting substrate 1200 may include polyimide, but is not limited thereto. The integrated circuit chip 1100 may be mounted on the mounting surface of the supporting substrate 1200 in a flip chip bonding manner through a plurality of electrode pads 922 and a plurality of connection terminals 980 connected to the plurality of electrode pads 922.

The integrated circuit package 1000 may include a plurality of interconnections 1300 that may be on the supporting substrate 1200. The plurality of interconnections 1300 may include metal, for example, copper (Cu). The plurality of interconnections 1300 may include an input interconnection portion 1310 and an output interconnection portion 1320. A plurality of input electrode pads 922A may be connected to the input interconnection electrode 1350 through the input interconnection portion 1310, and a plurality of output electrode pads 922B may be connected to the output interconnection electrode 1360 through the output interconnection portion 1320. It will be understood that first and second connection terminals of the integrated circuit chip 1100, as described herein, may each be electrically connected to a separate, respective interconnection of the plurality of interconnections.

As illustrated in FIG. 11B, a solder resist layer 1400 may be formed over the supporting substrate 1200. The solder resist layer 1400 may cover at least a part of the plurality of interconnections 1300. A portion connected to the connection terminal 980 in each of the input interconnection portion 1310 and the output interconnection portion 1320 of the plurality of interconnections 1300 may not be covered with the solder resist layer 1400. The solder resist layer 1400 may include an insulating ink, a photosensitive solder resist, or a solder resist film.

An underfill layer 1700 may be filled between the integrated circuit chip 1100 and the supporting substrate 1200 to prevent physical and/or chemical damage of the coupled structures of the integrated circuit chip 1100 and the supporting substrate 1200. The underfill layer 1700 may be made of ("may at least partially comprise") an epoxy resin.

The integrated circuit chip 1100 may include at least one electromagnetic shielding structure 1630. FIG. 11A illustrates a case where the integrated circuit chip 1100 includes one electromagnetic shielding structure 1630 having an island-shaped planar structure, but the integrated circuit chip 1100 may include a plurality of electromagnetic shielding structures 1630. In some example embodiments, the integrated circuit chip 1100 may include an electromagnetic shielding structure having a ring-shaped planar structure similar to the electromagnetic shielding structure 930C described with reference to FIGS. 10G and 10H, instead of the electromagnetic shielding structure 1630 having an island-shaped planar structure. The electromagnetic shielding structure 1630 may have a cross-sectional structure of any one of the electromagnetic shielding structures 102, 202, and 402 illustrated in FIGS. 1 to 8.

A ground electrode 1500 may be formed on the supporting substrate 1200. The electromagnetic shielding structure 1630 may be connected to the grounding electrode 1500 through any one interconnection selected from the plurality of interconnections 1300.

The plurality of electrode pads 922 and a portion of the plurality of interconnections 1300 that overlaps with the integrated circuit chip 1100 in the vertical direction (the Z direction) may be arranged under the integrated circuit chip 1100. Thus, when it is shown over the schematic plan view illustrated in FIG. 11A, the plurality of electrode pads 922 and the portion covered by the integrated circuit chip 1100 among the plurality of interconnections 1300 may not be seen.

Since the integrated circuit package 1000 according to the inventive concepts includes the electromagnetic shielding structure for shielding EMI in the inside the integrated circuit chip 1100, there is no need to form a separate shielding structure for shielding EMI at the outside of the integrated circuit chip 1100. Therefore, it is possible to overcome the structural limitations due to the increase of the occupied area of a separate shielding structure provided at the outside of the integrated circuit chip 1100, and may be advantageously applied to a display apparatus using FFD.

FIG. 12 is an example block diagram for explaining a display apparatus 2000 according to the inventive concepts.

Referring to FIG. 12, the display apparatus 2000 may include an application processor (hereinafter referred to as "AP") 2100, a DDI chip 2200, and a display panel 2300.

The AP 2100 may control the overall operation of the display apparatus 2000, and input and output data packets having display data in response to a clock (ECLK). The data packets may include display data, a horizontal synchronization signal Hsync, a vertical synchronization signal Vsync, a data activating signal DE, and the like.

The DDI chip 2200 may receive the data packets from the AP 2100 and may output the horizontal synchronization signal Hsync, the vertical synchronization signal Vsync, the data activating signal DE, and a display data RGB Data. In some example embodiments, the AP 2100 and the DDI chip 2200 may perform interfacing such as mobile industry processor interface (MIPI), mobile display digital interface (MDDI), compact display port (CDP), and the like. In some example embodiments, the DDI chip 2200 may include a graphic memory (GRAM) for high speed serial interface with the AP 2100. In some example embodiments, the DDI chip 2200 may buffer the data packets without using the GRAM for the high speed serial interface with the AP 2100 and output the display data.

The DDI chip 2200 may include any one of the integrated circuit chips 100, 200, 300, 400, 500, 600, 700, 800, 900, 900A, 900B, 900C, 900D, 900E, 900F, 900G, and 900H. Restated, the DDI chip 2200 may include any of the integrated circuit chips according to any of the example embodiments as described herein.

The display panel 2300 may be configured to display the display data (e.g., one or more instances of display data) in frame units under the control of the DDI chip 2200. The display panel 2300 may include an organic light emitting display (OLED) panel, a liquid crystal display (LCD) panel, a plasma display (PDP) panel, an electrophoretic display panel, or an electrowetting display panel. In some example embodiments, the display panel 2300 may be coupled to a touch screen (not shown) and configured to receive sensed data from the touch screen.

In the display apparatus 2000 according to the inventive concepts, the DDI chip 2200 may include the electromagnetic shielding structure for shielding EMI therein, for example, any one of the electromagnetic shielding structures 102, 202 and 402 shown in FIGS. 1 to 8. Therefore, the display apparatus 2000 including the DDI chip 2200 is no need to have a separate shielding structure for shielding EMI at the outside of the DDI chip 2200. Accordingly, it is possible to reduce the area of bevel at the edge of the display apparatus 2000, thereby further widening the screen area and improving the space usability.

FIGS. 13A to 13J are cross-sectional views illustrating an example method of manufacturing an integrated circuit chip according to some example embodiments of the inventive concepts. The example method of manufacturing the integrated circuit chip 100 illustrated in FIG. 1 will be described with reference to FIGS. 13A to 13J.

Figure 13A:
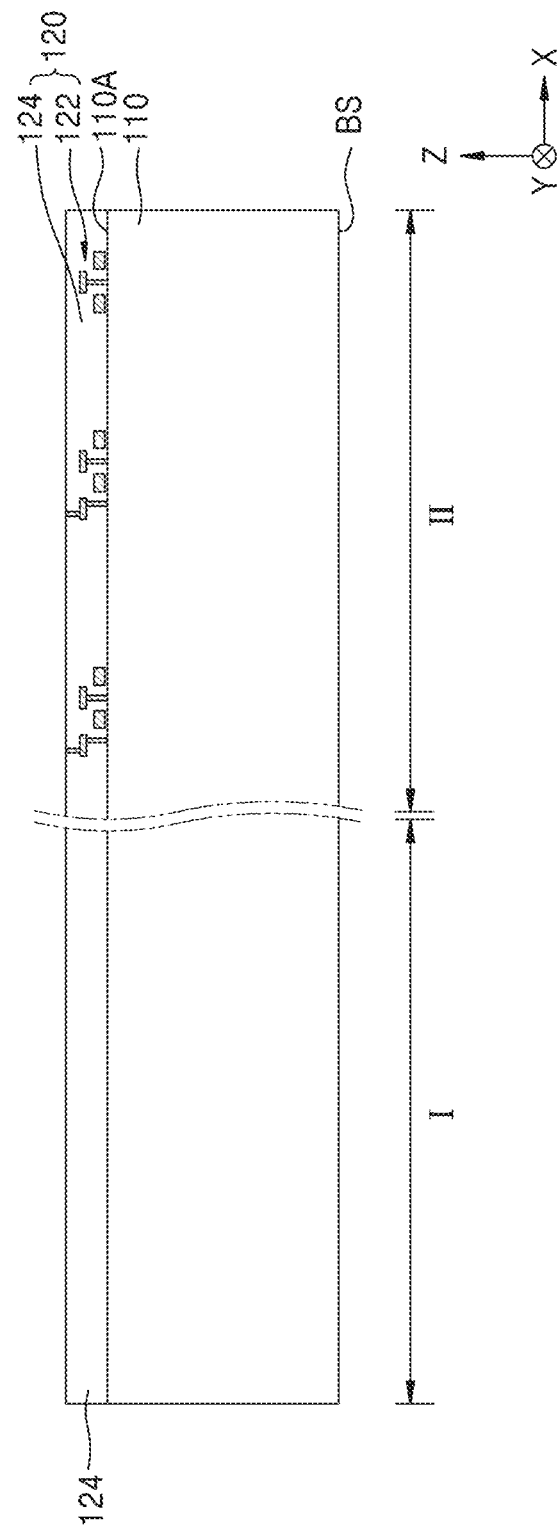
FIGS. 13A, 13B, 13C, 13D, 13E, 13F, 13G, 13H, 13I, and 13J are cross-sectional views illustrating an example method of manufacturing an integrated circuit chip according to some example embodiments of the inventive concepts.

Referring to FIG. 13A, the BEOL structure 130 may be formed on the first substrate 110.

The first substrate 110 may include the active surface 110A and an initial back surface BS which are opposed to each other and the FEOL structure 120 may be formed on the active surface 110A. The first substrate 110 may include the edge region I and the integrated circuit device region II. The edge region I may surround at least a part of the integrated circuit device region II. The first substrate 110 may be made of ("may at least partially comprise") silicon (Si).

The FEOL structure 120 may include the integrated circuit portion 122 and the interlayer insulating film 124 for mutually insulating individual devices comprising the integrated circuit portion 122 from each other. The integrated circuit portion 122 may be formed only in the integrated circuit device region II from among the edge region I and the integrated circuit device region II. The interlayer insulating film 124 may be formed to cover the active surface 110A of the first substrate 110 in the edge region I and the integrated circuit device region II.

Figure 13B:
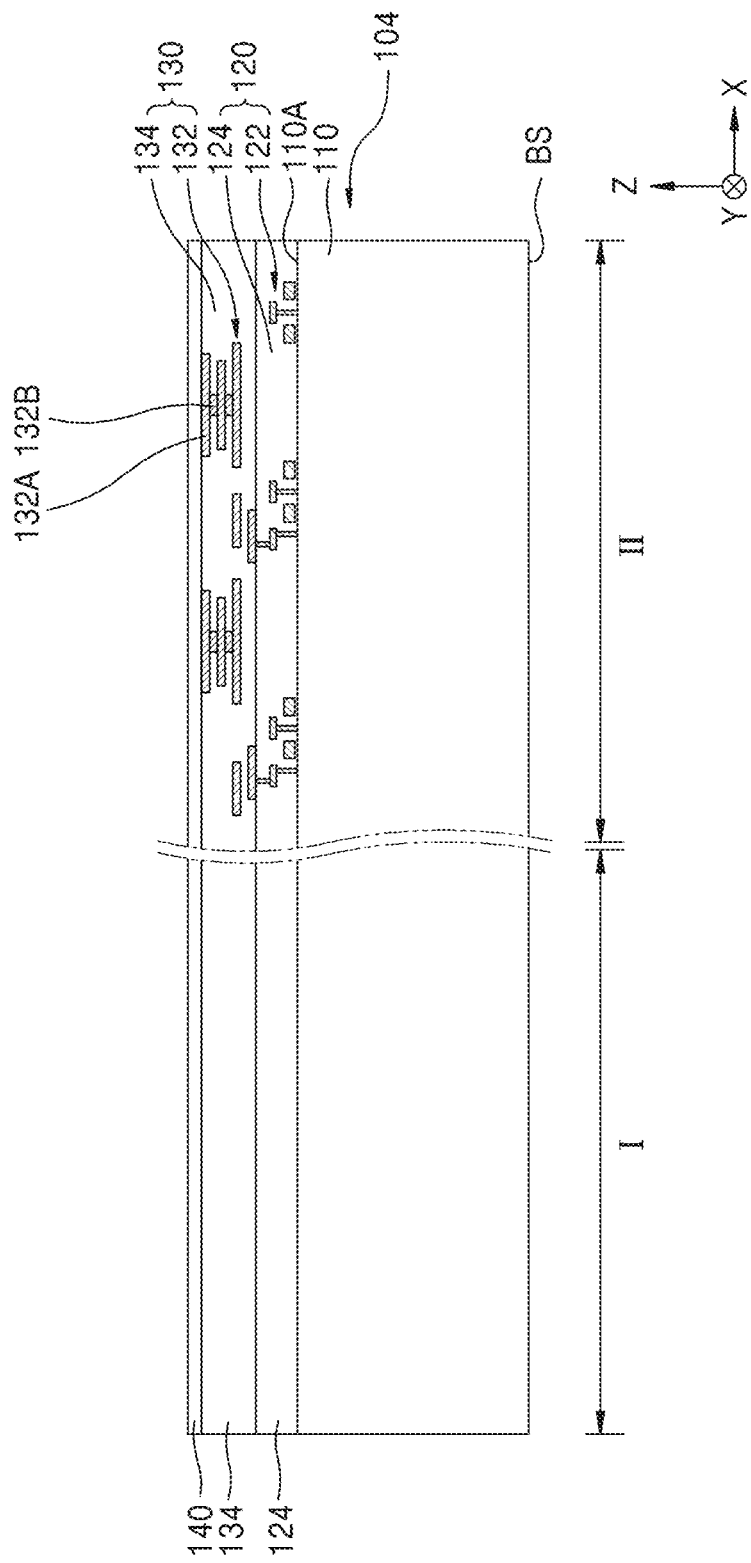

Referring to FIG. 13B, after forming the BEOL structure 130 on the FEOL structure 120, the first passivation film 140 covering the BEOL structure 130 may be formed in the edge region I and the integrated circuit device region II, thereby forming the circuit structure 104 including the first substrate 110.

The BEOL structure 130 may include the plurality of multilayer interconnection structures 132 and the intermetal insulating film 134. The plurality of multilayer interconnection structures 132 may each include the plurality of interconnection layers 132A and the plurality of contact plugs 132B for interconnecting the plurality of interconnection layers 132A with each other therebetween. The plurality of multilayer interconnection structures 132 may be formed only in the integrated circuit device region II of the edge region I and the integrated circuit device region II. The intermetal insulating film 134 may be formed to cover the FEOL structure 120 in the edge region I and the integrated circuit device region II. The second passivation film 180 may include an oxide film, a nitride film, or a combination thereof.

Figure 13C:
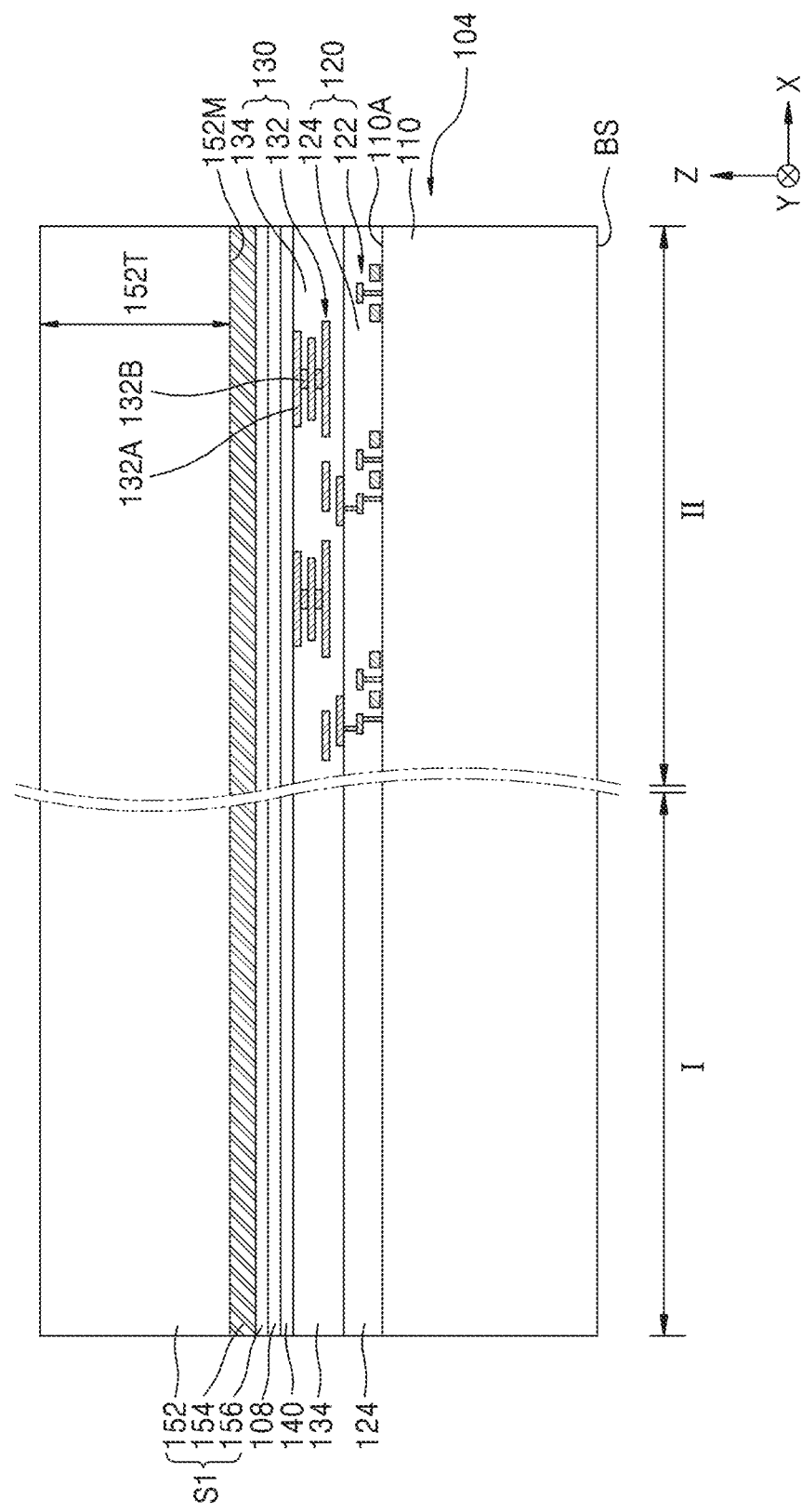

Referring to FIG. 13C, the grounding structure S1 including the second substrate 152, the grounding conductive layer 154 formed on the main surface 152M of the second substrate 152, and the insulating film 156 spaced apart from the second substrate 152 with the grounding conductive layer 154 therebetween may be formed. Thereafter, the grounding structure S1 may be bonded to the first substrate 110.

In order to bond the grounding structure S1 to the first substrate 110, the first substrate 110 and the second substrate 152 may be arranged such that the first passivation film 140 and the insulating film 156 of the grounding structure S1 face each other, and then the grounding structure S1 may be bonded on the first substrate 110 using the bonding layer 108. The bonding layer 108 may be made of ("may at least partially comprise") a SiCN film. The active surface 110A of the first substrate 110 may face the grounding conductive layer 154 after the grounding structure S1 is bonded on the first substrate 110.

The second substrate 152 may be made of ("may at least partially comprise") silicon. The second substrate 152 may have a thickness 152T of about 300 μm to about 400 μm, but is not limited thereto.

The grounding conductive layer 154 may be formed entirely on the main surface 152M of the second substrate 152. In some example embodiments, the grounding conductive layer 154 may be made of ("may at least partially comprise") an ion implanted semiconductor layer. For example, the grounding conductive layer 154 may include a P++ type Si layer or an N++ type Si layer. In some example embodiments, the grounding conductive layer 154 may be made of ("may at least partially comprise") a Si layer doped with boron. In some example embodiments, the grounding conductive layer 154 may be made of ("may at least partially comprise") a metal containing conductive layer. For example, the grounding conductive layer 154 may include Ti, TiN, W, TiW, or a combination thereof. The insulating film 156 may be made of ("may at least partially comprise") a silicon oxide film.

In some example embodiments, in order to form the grounding structure S1, after the insulating film 156 is formed on the Si substrate, the grounding conductive layer 154 may be formed by implanting dopant ions into a part of the Si substrate through the insulating film 156. A region of the Si substrate other than the grounding conductive layer 154 may remain as the second substrate 152. In this case, the grounding conductive layer 154 may include a P++ type Si layer or an N++ type Si layer.

In some other embodiments, the grounding conductive layer 154 and the insulating film 156 may be sequentially formed on the main surface 152M of the second substrate 152 using a deposition process to form the grounding structure S1. In this case, the grounding conductive layer 154 may include Ti, TiN, W, TiW, or a combination thereof.

Figure 13D:
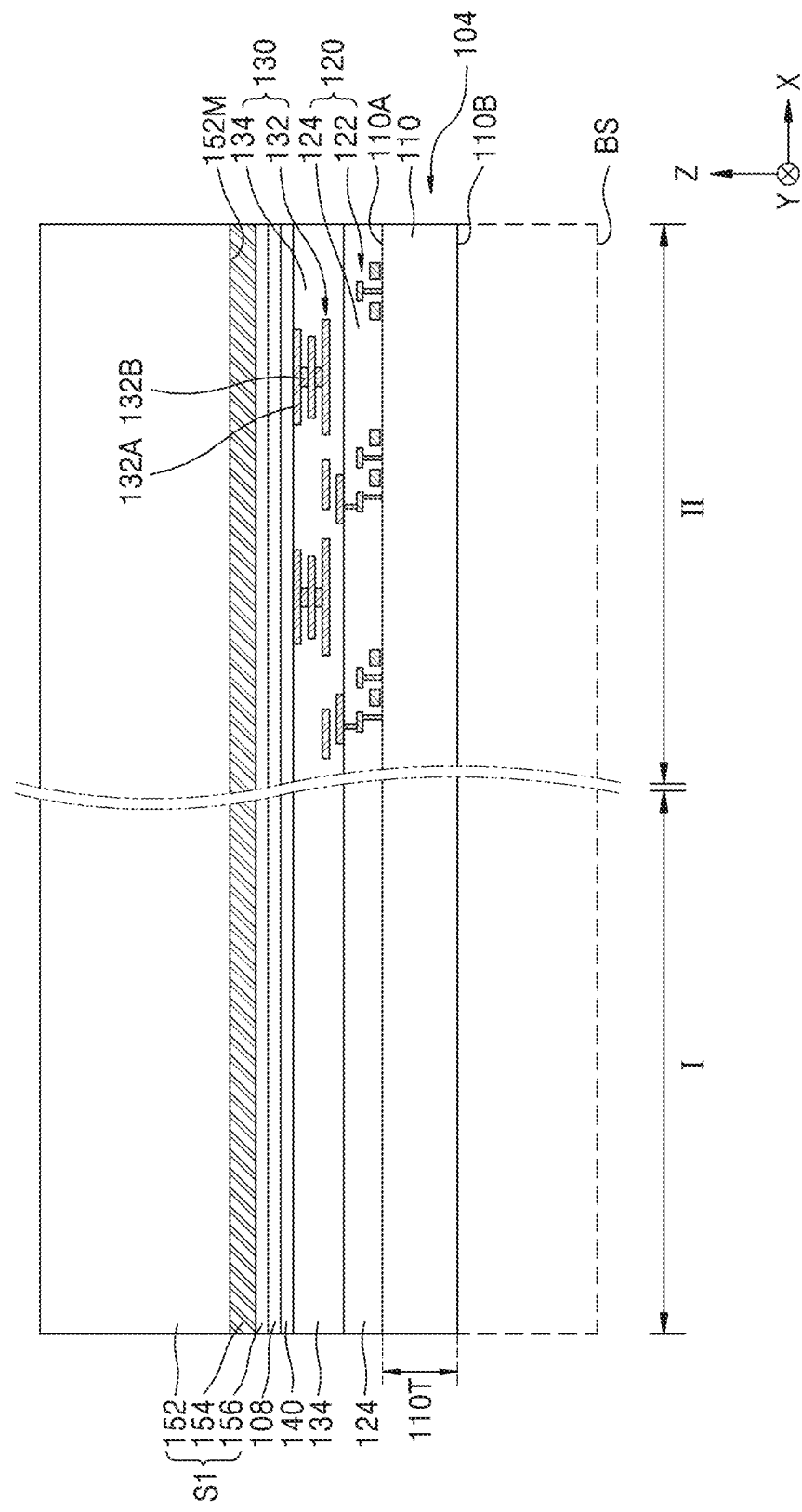

Referring to FIG. 13D, a thinning process of the first substrate 110 may be performed. After the first substrate 110 is thinned, a new back surface 110B of the first substrate 110 may be exposed on the opposite side of the active surface 110A of the first substrate 110. After the first substrate 110 is thinned, the first substrate 110 may have a thickness 110T of about 5 μm to about 10 μm, but is not limited thereto.

In order to perform the thinning process, a portion of the thickness of the first substrate 110 may be removed from the initial back surface BS of the first substrate 110 using the etching process, the polishing process, the grinding process, or the combination thereof.

In some example embodiments, the first substrate 110 and the structures formed on the active surface 110A of the first substrate 110 may be protected by the second substrate 152 during the thinning process of the first substrate 110. In some other embodiments, the thinning process of the first substrate 110 may be performed while an additional support (not shown) is attached on the opposite side of the main surface 152M of the second substrate 152. The additional support may include a substrate made of a hard material or a stretchable tape made of a soft material. The substrate made of the hard material may include glass, silicon, metal, or polymer.

Figure 13E:
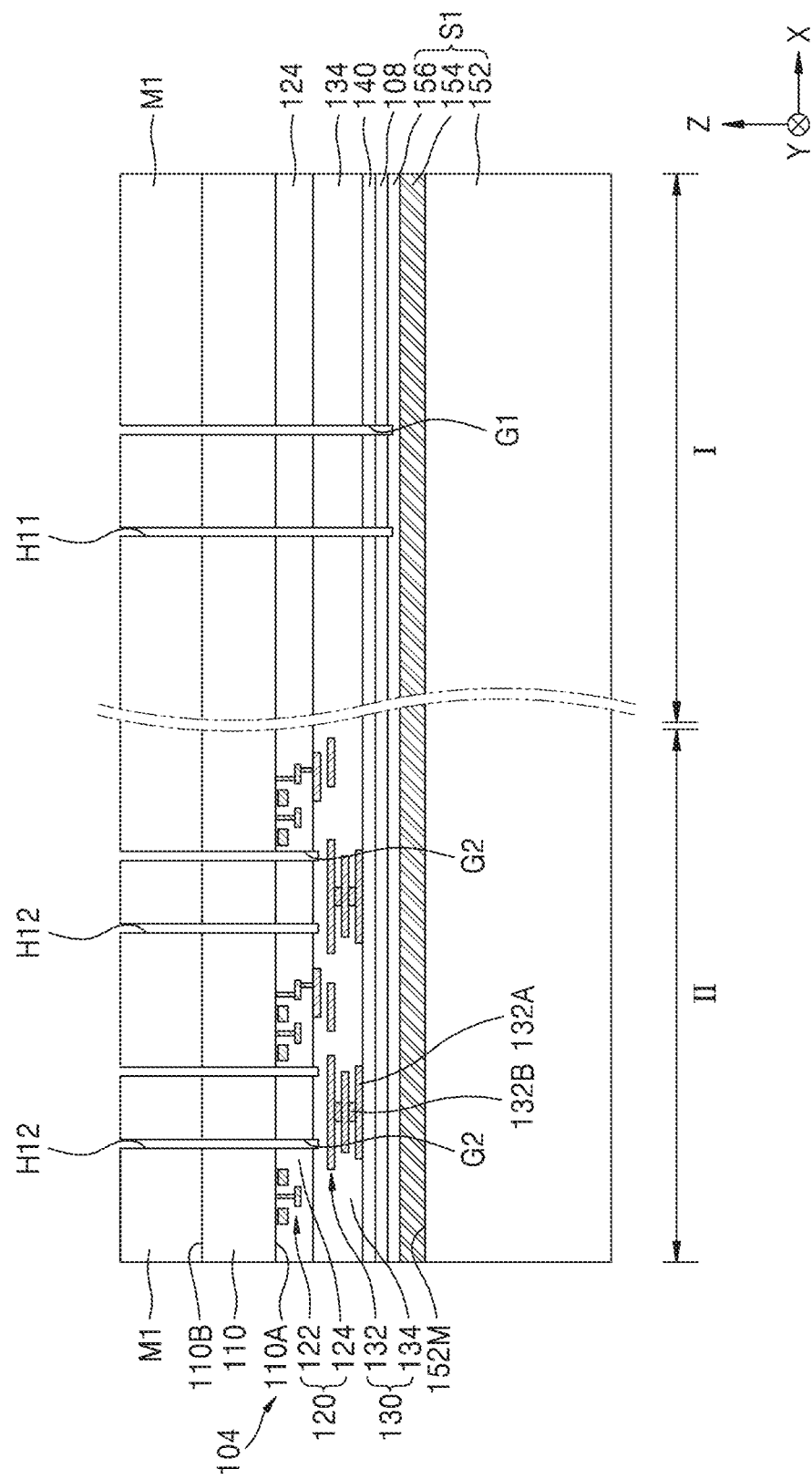

Referring to FIG. 13E, the result of FIG. 13D may be inverted so that the direction to which the active surface 110A and the back surface 110B of the thinned first substrate 110 face is reversed, and then a first mask pattern M1 covering the back surface 110B of the first substrate 110 may be formed in the edge region I and the integrated circuit device region II. A plurality of first openings H11 and H12 may be formed in the first mask pattern M1. The plurality of first openings H11 and H12 may include at least one first opening H11 in the edge region I and a plurality of first openings H12 in the integrated circuit device region II. The first mask pattern M1 may be made of ("may at least partially comprise") a photoresist pattern. The plurality of first openings H11 and H12 may each have a ring-shape in a plane (for example, an X-Y plane).

The lower structures exposed through the first openings H11 and H12 may be anisotropically etched using the first mask pattern M1 as an etching mask to form a plurality of grooves G1 and G2. The plurality of grooves G1 and G2 may include at least one groove G1 in the edge region I and a plurality of grooves G2 in the integrated circuit device region II. The plurality of grooves G1 and G2 may be a space having a ring-shape in a plane (for example, the X-Y plane) and extending lengthily in the vertical direction (the Z direction). At least one groove G1 in the edge region I may extend lengthily in the vertical direction (the Z direction) while penetrating the first substrate 110, the interlayer insulating film 124 of the FEOL structure 120, the intermetal insulating film 134 of the BEOL structure 130, the first passivation film 140 and the bonding layer 108, and may have a bottom surface exposing the insulating film 156. A plurality of grooves G2 in the integrated circuit device region II may extend lengthily in the vertical direction (the Z direction) while penetrating the first substrate 110 and the interlayer insulating film 124 of the FEOL structure 120, and may have a bottom surface exposing the metal interlayer insulating film 134 of the BEOL structure 130.

Figure 13F:
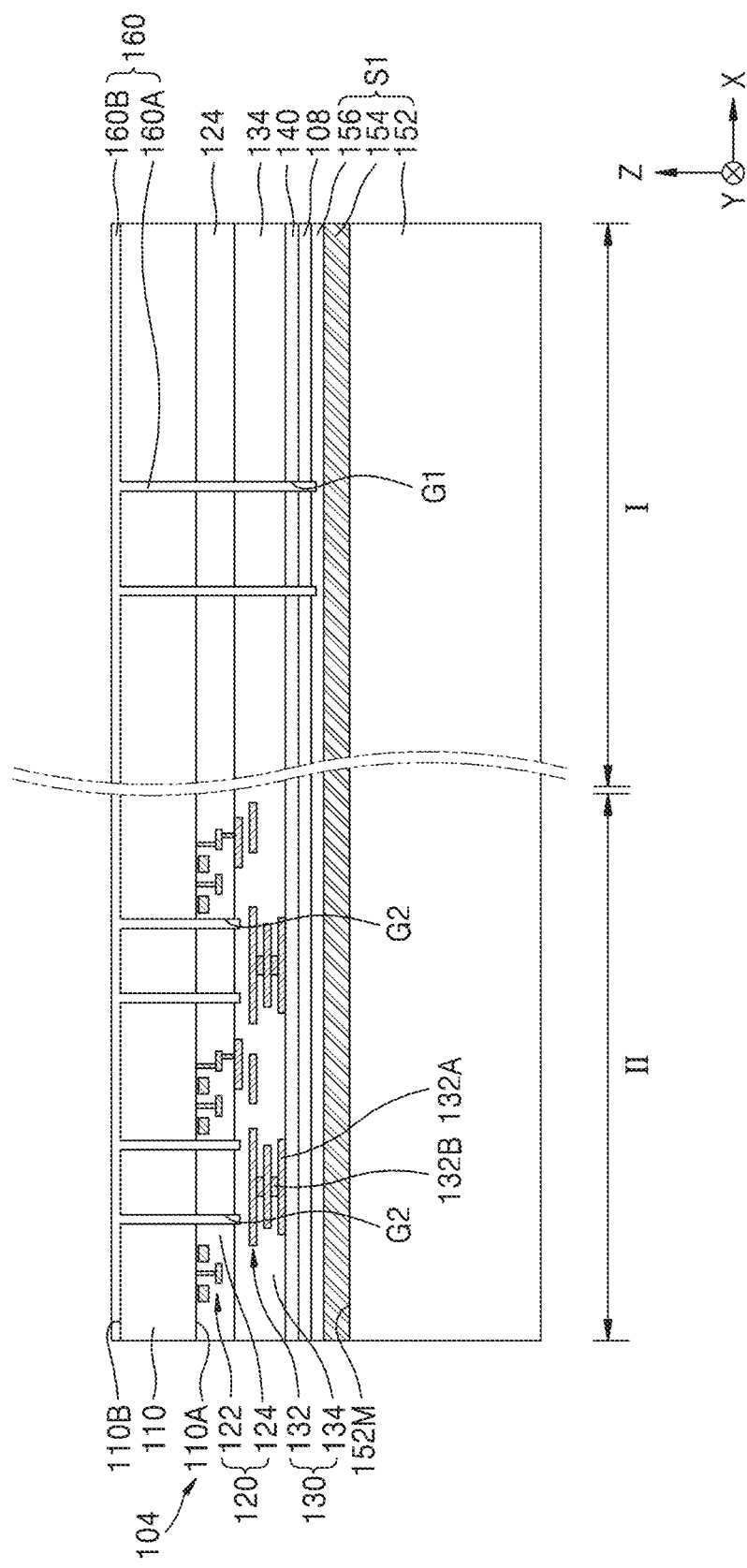

Referring to FIG. 13F, the first mask pattern M1 may be removed from the result of FIG. 13E and the insulating film 160 may be formed to cover the back surface 110B of the first substrate 110 and filling the plurality of grooves G1 and G2. The insulating film 160 may include the penetrating insulating portion 160A filling the plurality of grooves G1 and G2 and the insulating liner portion 160B covering the back surface 110B of the first substrate 110 at the outside of the plurality of grooves G1 and G2.

The insulating film 160 may include an aluminum oxide film or a hafnium oxide film. In some example embodiments, at least a portion of the penetrating insulating portion 160A may include an air gap. The penetrating insulating portion 160A may have a ring-shaped planar structure.

Figure 13G:
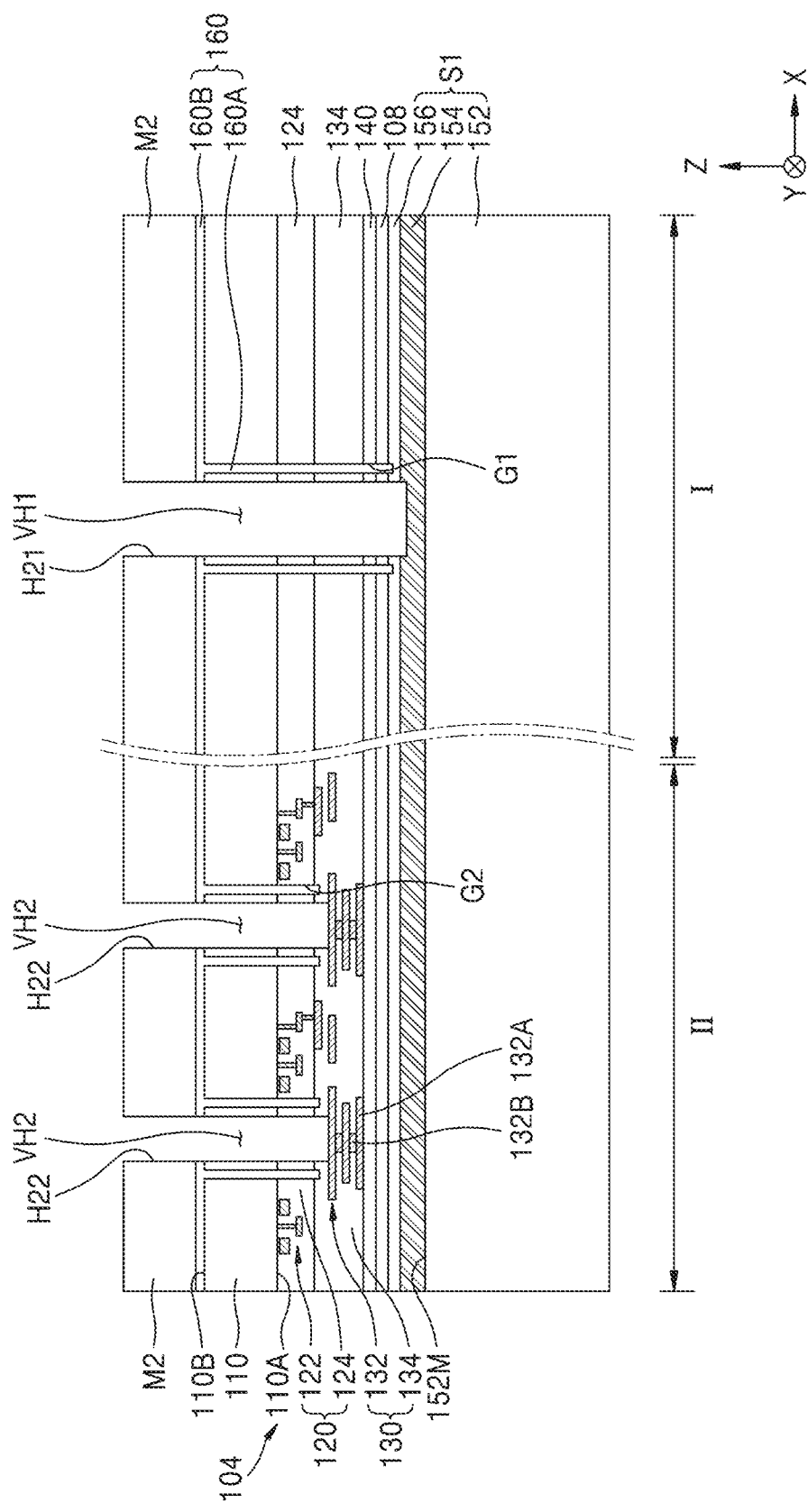

Referring to FIG. 13G, a second mask pattern M2 having a plurality of second openings H21 and H22 may be formed on the insulating film 160 in the edge region I and the integrated circuit device region II, and then the insulating liner portion 160B exposed through the plurality of second openings H21 and H22 and underlying structures thereof may be anisotropically etched using the mask pattern M2 as an etching mask, thereby forming a plurality of through via holes VH1 and VH2.

The plurality of through via holes VH1 and VH2 may include at least one through via hole VH1 in the edge region I and the plurality of through via holes VH2 in the integrated circuit device region II. At least one through via hole VH1 in the edge region I may extend lengthily in the vertical direction (the Z direction) through the insulating liner portion 160B of the insulating film 160, the first substrate 110, the interlayer insulating film 124 of the FEOL structure 120, the intermetal insulating film 134 of the BEOL structure 130, the first passivation film 140 and the bonding layer 108, and may have a bottom surface exposing the grounding conductive layer 154. A plurality of through via holes VH2 in the integrated circuit device region II may each extend lengthily in the vertical direction (the Z direction) while penetrating the insulating liner portion 160B of the insulating film 160, the first substrate 110, the interlayer insulating film 124 of the FEOL structure 120, and a part of the intermetal insulating film 134 of the BEOL structure 130, and may have a bottom surface exposing the multilayer interconnection structure 132.

The second mask pattern M2 may be made of ("may at least partially comprise") a photoresist pattern. The plurality of through via holes VH1 and VH2 may be formed at a position spaced apart from the penetrating insulating portion 160A in a planar region defined by the penetrating insulating portion 160A.

Figure 13H:
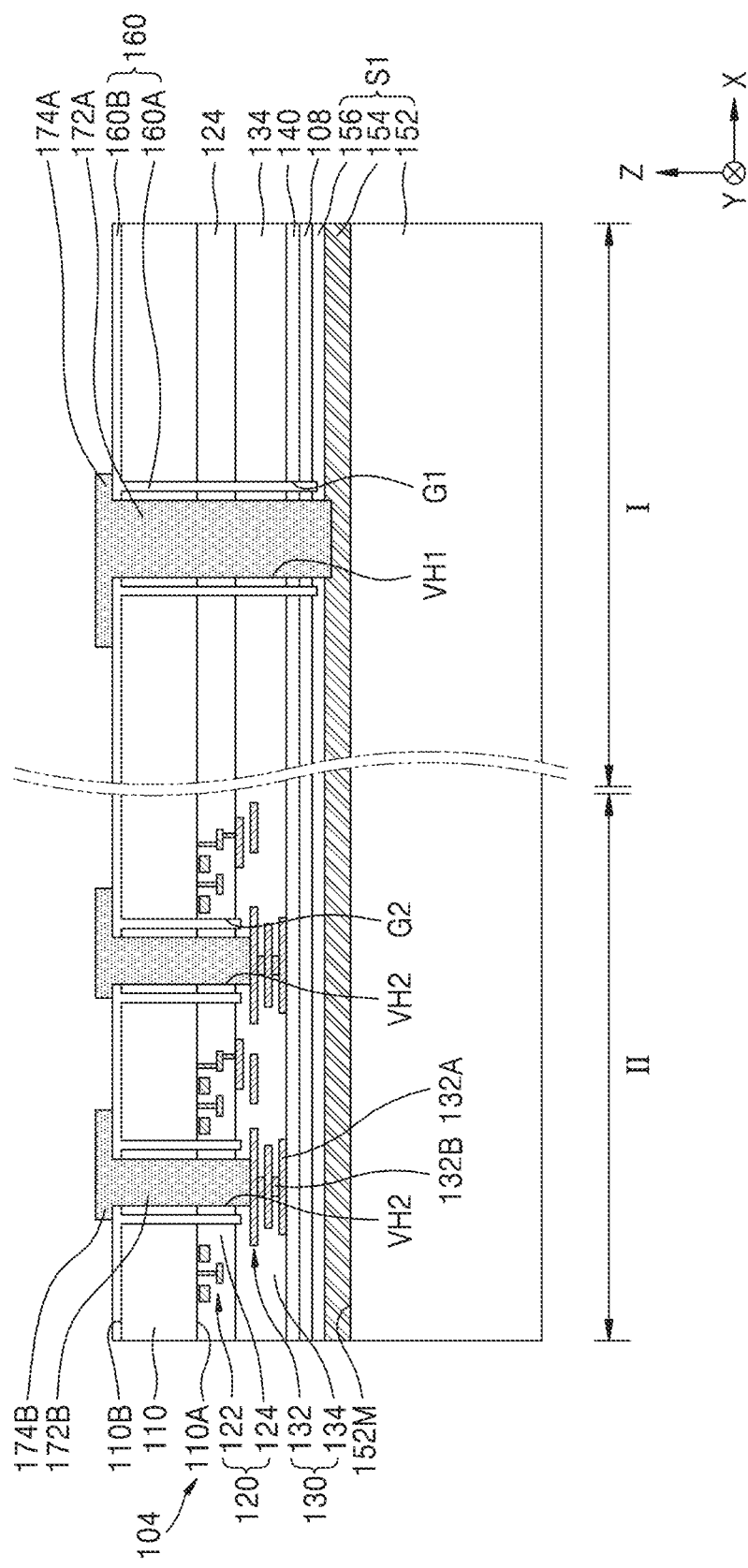

Referring to FIG. 13H, the second mask pattern M2 may be removed from the result of FIG. 13G, and then the at least one first penetrating electrode portion 172A filling the at least one through via hole VH1 and the at least one first pad portion 174A connected to the at least one first penetrating electrode portion 172A may be formed in the edge region I, and the second penetrating electrode portion 172B filling the plurality of through via holes VH2 and the plurality of second pad portions 174B connected to the plurality of second penetrating electrode portions 172B may be formed in the integrated circuit device region II.

In some example embodiments, the at least one first penetrating electrode portion 172A and the at least one first pad portion 174A may be integrally connected to each other one by one in the edge region I, and the plurality of second penetrating electrode portions 172B and the plurality of second pad portions 174B may be integrally connected to each other one by one in the integrated circuit device region II. The at least one first pad portion 174A and the plurality of second pad portions 174B may face the back surface 110B of the first substrate 110 and extend in the horizontal direction, and may be spaced apart from the back surface 110B of the first substrate 110 with the insulating liner portion 160B therebetween.

Figure 13I:
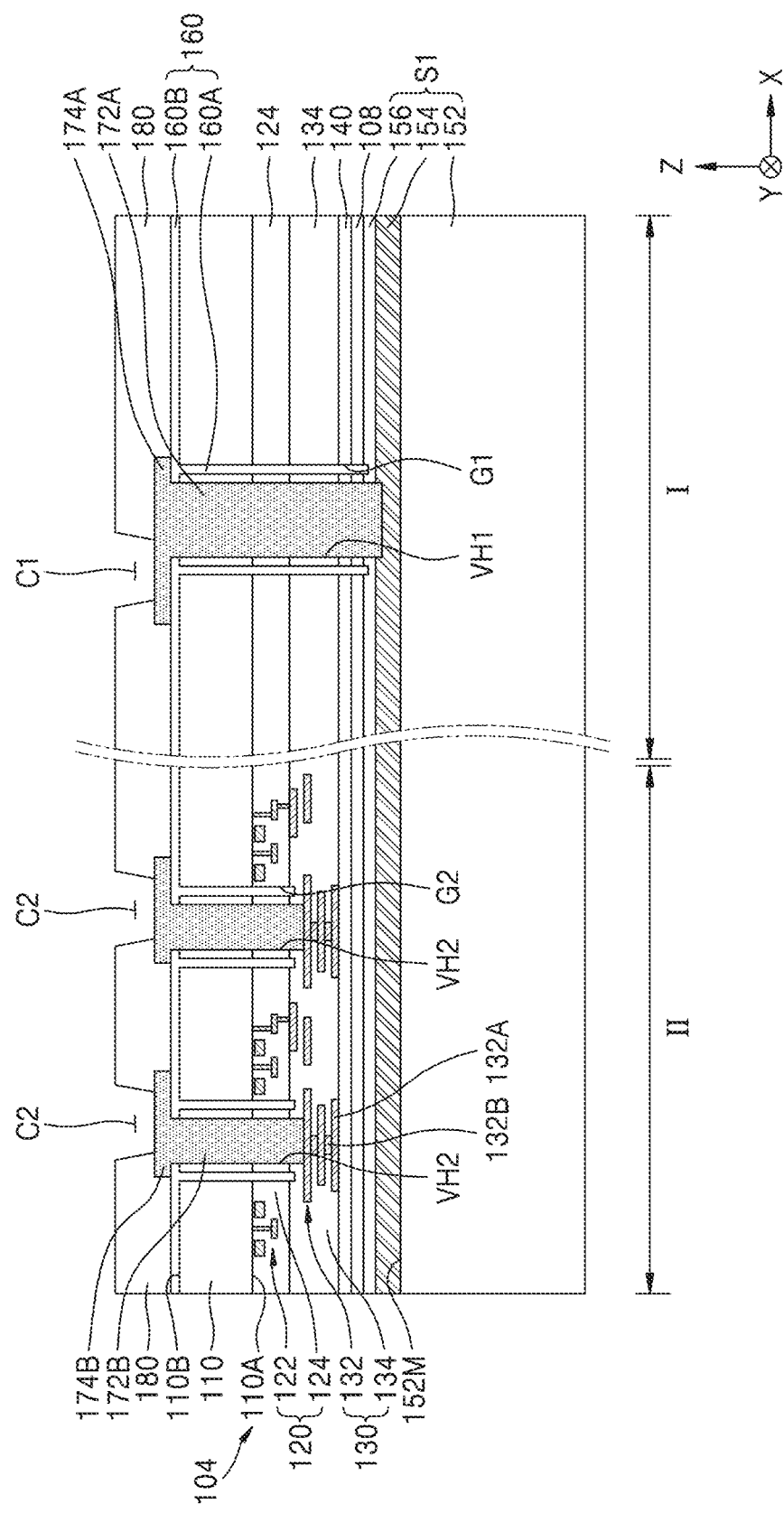

Referring to FIG. 13I, the second passivation film 180 may be formed to cover the at least one first pad portion 174A, the plurality of second pad portions 174B, and the insulating liner portion 160B in the edge region I and the integrated circuit device region II, and portions of the second passivation film 180 may be removed to form the at least one first contact hole C1 exposing a contact region of the at least one first pad portion 174A in the edge region I and the plurality of second contact holes C2 exposing contact regions of the plurality of second pad portions 174B in the integrated circuit device region II.

Figure 13J:
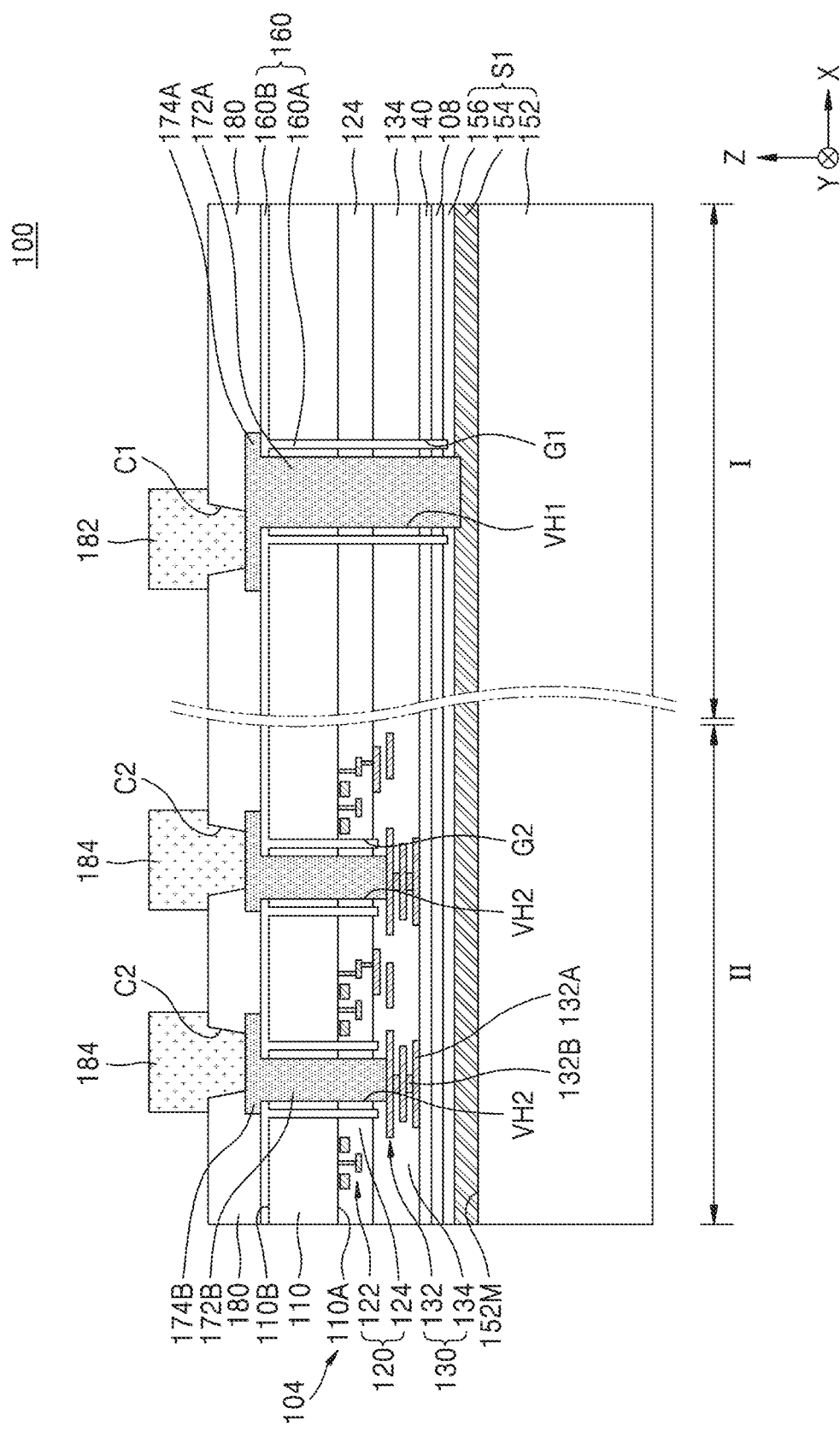

Referring to FIG. 13J, the at least one first connection terminal 182 connected to the at least one first pad portion 174A through the at least one first contact hole C1 in the edge region I and the plurality of second connection terminals 184 connected to the plurality of first pad portions 174A through the plurality of second contact holes C2 in the integrated circuit device region II may be formed, thereby forming the integrated chip 100 illustrated in FIG. 1.

Figure 14A:
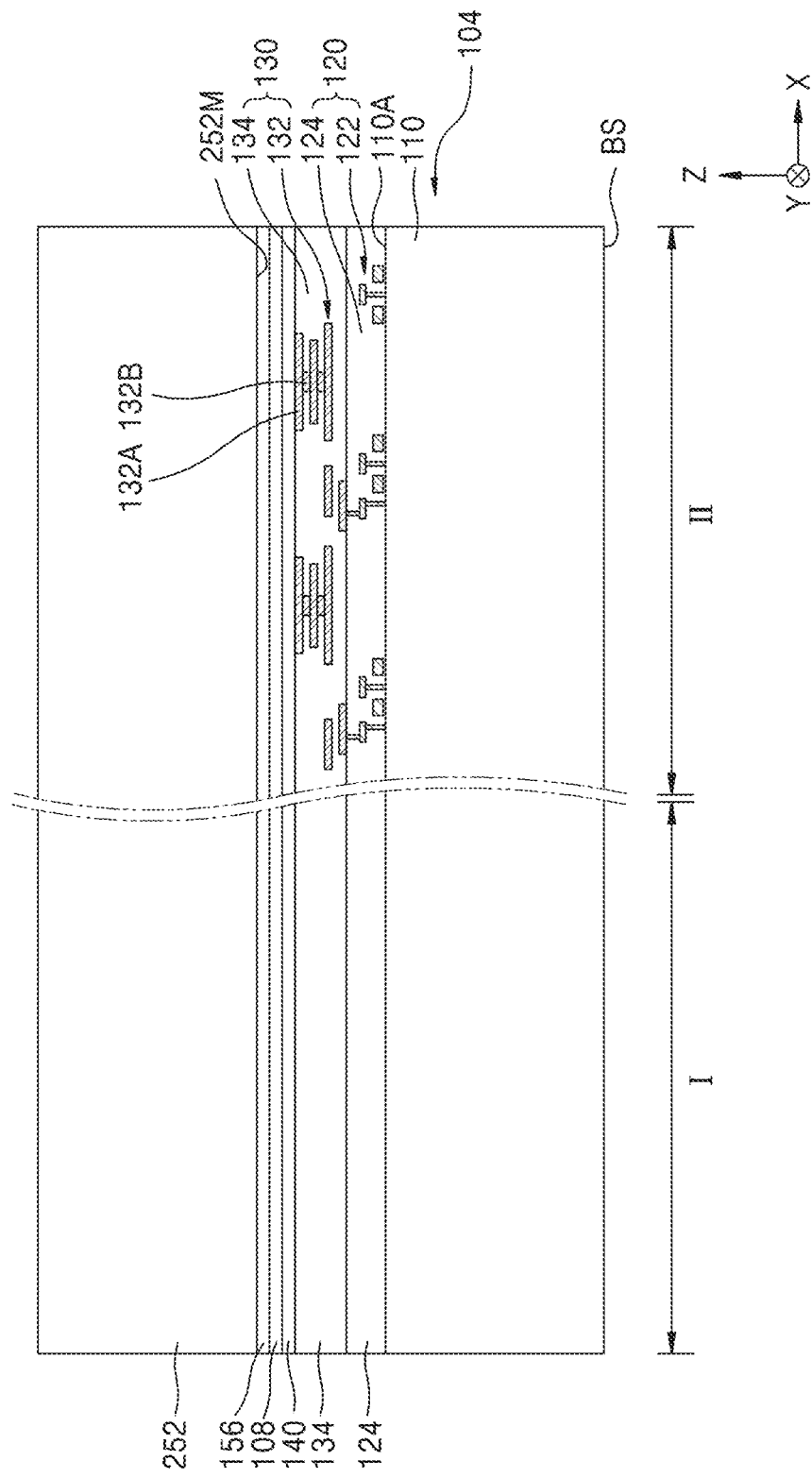
FIGS. 14A, 14B, and 14C are cross-sectional views illustrating process steps for explaining an example manufacturing method of an integrated circuit chip according to some example embodiments of the inventive concepts.
Figure 14B:
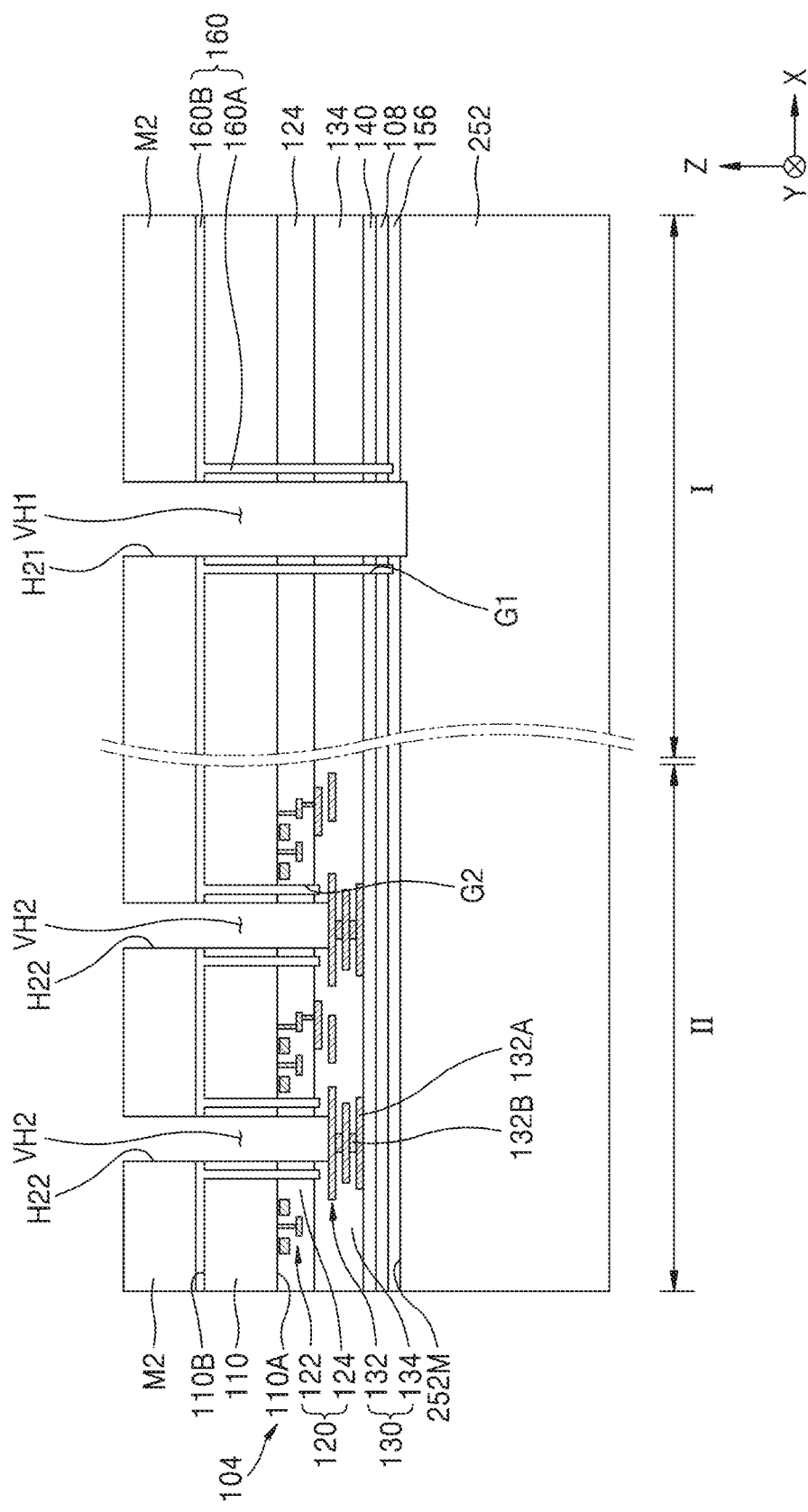
Figure 14C:
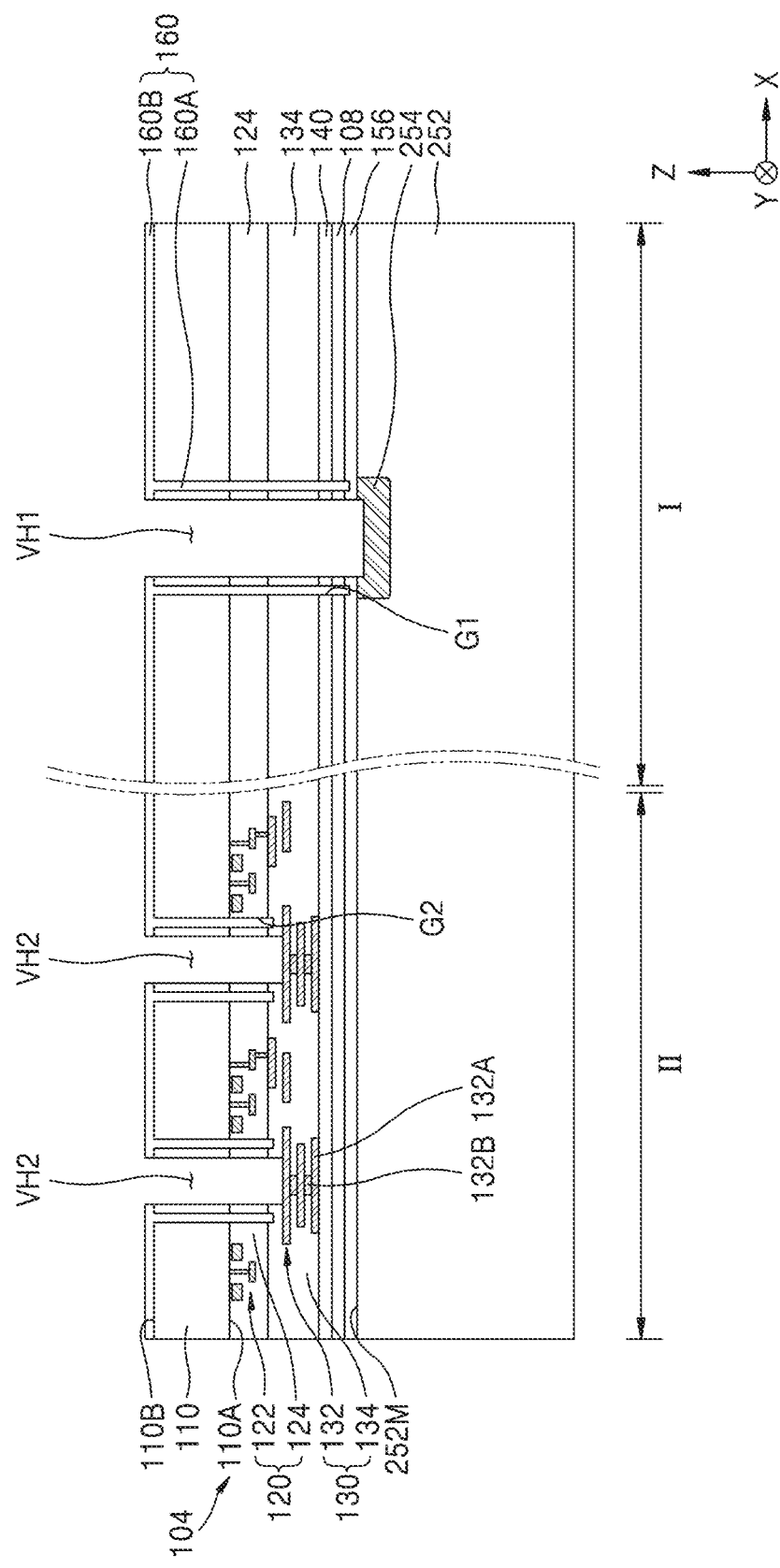

FIGS. 14A to 14C are cross-sectional views illustrating process steps for explaining an example manufacturing method of an integrated circuit chip according to some example embodiments of the inventive concepts. An example manufacturing method of the integrated circuit chip 200 illustrated in FIG. 2 will be described with reference to FIGS. 14A to 14C.

Referring to FIG. 14A, the processes described with reference to FIGS. 13A to 13C may be performed. However, in this example, instead of the grounding structure 51 including the grounding conductive layer 154, the stacked structure of the second substrate 252 and the insulating film 156 may be bonded on the first passivation film 140 on the first substrate 110 using the bonding layer 108. In the stacked structure, the insulating film 156 may be stacked on the main surface 252M of the second substrate 252.

Referring to FIG. 14B, the processes described with reference to FIGS. 13D to 13G with respect to the result of FIG. 14A may be performed, thereby forming the plurality of through via holes VH1 and VH2 in the edge region I and the integrated circuit device region II. In this example, the second substrate 252 may be exposed from the bottom surface of the through via hole VH1 in the edge region I.

Referring to FIG. 14C, the second mask pattern M2 may be removed from the result of FIG. 14B, and the grounding conductive layer 254 may be formed by implanting dopant ions into the second substrate 252 through the through via hole VH1 in the edge region I. The integrated circuit device region II may be covered with an ion implantation mask pattern (not shown) during the ion implantation process for forming the grounding conductive layer 254. Thereafter, the integrated circuit chip 200 illustrated in FIG. 2 may be manufactured by performing the processes described with reference to FIGS. 13H to 13J.

The processes described with reference to FIGS. 13A to 13J may be used to manufacture the integrated circuit chip 700 illustrated in FIG. 7. Particularly, during formation of the plurality of grooves G1 and G2 by the method described with reference to FIG. 13E in the state before the integrated circuit chip 700 is individualized through the sawing process, the slit SL (see FIG. 7) may be formed at the outermost side of the edge region I by removing a part of each of the first substrate 110, the FEOL structure 120, the BEOL structure 130, the bonding layer 108, the insulating film 156, the grounding conductive layer 154 and the second substrate 152 in a scribe lane defining the edge region I, for example the scribe lane SL shown in FIG. 9. Then, the insulating protective film 760 filling the slit SL may be formed while forming the insulating film 160 by the method described with reference to FIG. 13F. Thereafter, the processes described with reference to FIGS. 13G to 13J may be performed and the sawing process may be performed along a path passing through the insulating protective film 760 to obtain the integrated circuit chip 700 illustrated in FIG. 7.

Although the manufacturing methods of the integrated circuit chips 100, 200, and 700 illustrated in FIGS. 1, 2, and 7 have been described with reference to FIGS. 13A to 13J and FIGS. 14A to 14C, it will be understood to person skilled in the arts that the integrated circuit chips 300, 400, 500, 600, 700, 800, 900, 900A, 900B, 900C, 900D, 900E, 900F, 900G, and 900H described with reference to FIGS. 3 to 10H may be manufactured by using the above-described manufacturing methods and various methods that have been variously modified and changed within the spirit of the inventive concepts.

While the inventive concepts has been particularly shown and described with reference to embodiments thereof, it will be understood that various changes in form and details may be made therein without departing from the spirit and scope of the following claims.

What is claimed is:
1. An integrated circuit chip, comprising:
a circuit structure including a first substrate having an active surface and a back surface opposite to the active surface, a front-end-of-line (FEOL) structure on the active surface of the first substrate, the FEOL structure including an integrated circuit portion, and a back-end-of-line (BEOL) structure on the FEOL structure, the BEOL structure including a plurality of multilayer interconnection structures that are connected to the integrated circuit portion;

a grounding structure including a second substrate isolated from direct contact with the first substrate with the FEOL structure and the BEOL structure therebetween, and a grounding conductive layer between the second substrate and the BEOL structure;

a bonding layer between the circuit structure and the grounding structure;

a first penetrating electrode portion connected to the grounding conductive layer based on extending through the first substrate, the FEOL structure, the BEOL structure, and the bonding layer such that the first penetrating electrode portion is isolated from direct contact with the integrated circuit portion in a horizontal direction extending parallel to the active surface of the first substrate; and an insulating film between the grounding conductive layer and the bonding layer, wherein the bonding and the insulating film include different total material compositions.

2. The integrated circuit chip of claim 1, wherein the grounding conductive layer is entirely on the second substrate along a main surface of the second substrate facing the active surface, and the grounding conductive layer includes a first portion in contact with the first penetrating electrode portion and a second portion overlapping with the integrated circuit portion in a vertical direction extending perpendicular to the active surface of the first substrate.

3. The integrated circuit chip of claim 1, wherein the grounding conductive layer is limited to extending locally around one end of the first penetrating electrode portion such that the grounding conductive layer does not overlap with the integrated circuit portion in a vertical direction extending perpendicular to the active surface of the first substrate.

4. The integrated circuit chip of claim 1, wherein the grounding conductive layer includes a semiconductor layer including impurity ions or a metal-containing conductive layer.

5. The integrated circuit chip of claim 1, further comprising:

a second penetrating electrode portion connected to one multilayer interconnection structure of the plurality of multilayer interconnection structures based on extending through the first substrate and the FEOL structure, wherein the first penetrating electrode portion and the second penetrating electrode portion have different vertical lengths from each other.

6. An integrated circuit chip, comprising:

a circuit structure including a first substrate including an integrated circuit device region and an edge region surrounding the integrated circuit device region in a horizontal plane extending parallel to an active surface of the first substrate, a front-end-of-line (FEOL) structure on the active surface of the first substrate in the integrated circuit device region, the FEOL structure including an integrated circuit portion, and a back-end-of-line (BEOL) structure connected to the integrated circuit portion, the BEOL structure including a plurality of multilayer interconnection structures;

a grounding structure including a second substrate isolated from direct contact with the first substrate in the integrated circuit device region and the edge region with the FEOL structure and the BEOL structure therebetween, and a grounding conductive layer between the second substrate and the BEOL structure;

a bonding layer between the circuit structure and the grounding structure in the integrated circuit device region and the edge region;

a first penetrating electrode portion connected to the grounding conductive layer based on extending through the first substrate, the FEOL structure, the BEOL structure, and the bonding layer in the edge region and extending in a vertical direction extending perpendicular to the active surface of the first substrate;

a second penetrating electrode portion connected to one multilayer interconnection structure of the plurality of multilayer interconnection structures based on extending through the first substrate and the FEOL structure in the integrated circuit device region; and an insulating film between the grounding conductive layer and the bonding layer, wherein the bonding layer and the insulating film include different total material compositions.

7. The integrated circuit chip of claim 6, wherein the grounding conductive layer includes a semiconductor layer including impurity ions or a metal-containing conductive layer.

8. The integrated circuit chip of claim 6, wherein the grounding conductive layer faces the active surface of the first substrate in the integrated circuit device region and the edge region.

9. The integrated circuit chip of claim 6, wherein the grounding conductive layer is limited to extend locally only in the edge region of the integrated circuit device region and the edge region.

10. The integrated circuit chip of claim 6, further comprising:

a guard ring located in the edge region and surrounding the integrated circuit device region and the first penetrating electrode portion in the horizontal plane, wherein one end of the guard ring is in contact with the grounding conductive layer.

11. The integrated circuit chip of claim 6, further comprising:

a guard ring located in the edge region and surrounding the integrated circuit device region and the first penetrating electrode portion in the horizontal plane, wherein the guard ring is isolated from direct contact with the grounding conductive layer in the vertical direction.

12. The integrated circuit chip of claim 6, further comprising:

an insulating protective film covering a side wall of the grounding conductive layer facing an outside of the integrated circuit chip in the edge region, wherein the insulating protective film and the bonding layer include different total material compositions.

13. The integrated circuit chip of claim 12, wherein the insulating protective film extends in the vertical direction to cover a sidewall of the first substrate, a sidewall of the FEOL structure, a sidewall of the BEOL structure, and a sidewall of the bonding layer.

14. The integrated circuit chip of claim 12, further comprising:
a penetrating insulating portion surrounding at least a portion of the first penetrating electrode portion at a position isolated from direct contact with the first penetrating electrode portion in a horizontal direction extending parallel to the active surface of the first substrate in the edge region, and extending in the vertical direction based on extending through the first substrate, the FEOL structure, the BEOL structure, and the bonding layer,
wherein the insulating protective film includes a same total material composition as the penetrating insulating portion.

15. An integrated circuit chip, comprising:
a circuit structure including
a first substrate having an active surface and a back surface opposite to each other,
a front-end-of-line (FEOL) structure on the active surface of the first substrate, the FEOL structure including an integrated circuit portion, and
a back-end-of-line (BEOL) structure on the FEOL structure, the BEOL structure including a plurality of multilayer interconnection structures that are connected to the integrated circuit portion;
a grounding structure including
a second substrate facing the active surface, and
a grounding conductive layer between the second substrate and the BEOL structure;
a first penetrating electrode portion connected to the grounding conductive layer based on extending through the first substrate, the FEOL structure, and the BEOL structure such that the first penetrating electrode portion is isolated from direct contact with the integrated circuit portion in a horizontal direction extending parallel to the active surface of the first substrate;
a second penetrating electrode portion connected to one multilayer interconnection structure of the plurality of multilayer interconnection structures based on extending through the first substrate and the FEOL structure;
a first connection terminal on the back surface of the first substrate and configured to be electrically connected to the first penetrating electrode portion;
a second connection terminal on the back surface of the first substrate and configured to be electrically connected to the second penetrating electrode portion;
a bonding layer between the circuit structure and the grounding structure; and
an insulating film between the grounding conductive layer and the bonding layer, wherein the bonding layer and the insulating film inlcude different total material compositions.

16. The integrated circuit chip of claim 15, wherein
the grounding conductive layer extends entirely on the second substrate so as to overlap with the first penetrating electrode portion and the second penetrating electrode portion in a vertical direction extending perpendicular to the active surface, and
the grounding conductive layer includes a semiconductor layer containing impurity ions or a metal-containing conductive layer.

17. The integrated circuit chip of claim 15, wherein
the grounding conductive layer is limited to extend locally around one end of the first penetrating electrode portion so as to overlap with the first penetrating electrode portion in a vertical direction extending perpendicular to the active surface and to not overlap with the second penetrating electrode portion in the vertical direction, and
the grounding conductive layer includes a semiconductor layer containing impurity ions.

18. An integrated circuit package, comprising:
the integrated circuit chip according to claim 15;
a supporting substrate including a mounting surface on which the integrated circuit chip is mounted; and
a plurality of interconnections on the supporting substrate,
wherein the first connection terminal and the second connection terminal of the integrated circuit chip are each electrically connected to separate, respective interconnections of the plurality of interconnections.

19. A display apparatus, comprising:
a display driver IC (DDI) chip including the integrated circuit chip according to claim 15; and
a display panel configured to display one or more instances of display data under control of the DDI chip.

* * * * *